(12) United States Patent
Suwa et al.

(10) Patent No.: US 7,138,846 B2
(45) Date of Patent: Nov. 21, 2006

(54) FIELD EFFECT TRANSISTOR SWITCH CIRCUIT

(75) Inventors: Atsushi Suwa, Katano (JP); Tadayoshi Nakatsuka, Toyonaka (JP); Tadashi Komatsu, Wake (JP); Katsushi Tara, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/322,589

(22) Filed: Dec. 19, 2002

(65) Prior Publication Data
US 2003/0116780 A1 Jun. 26, 2003

(30) Foreign Application Priority Data
Dec. 20, 2001 (JP) ............................. 2001-387696

(51) Int. Cl.
*H03L 5/00* (2006.01)
(52) U.S. Cl. .................. 327/308; 327/389; 327/391; 333/101; 333/81 R
(58) Field of Classification Search ................ 327/308, 327/389, 391; 333/101, 81 R, 103
See application file for complete search history.

(56) References Cited

U.S. PATENT DOCUMENTS

| | | | | |
|---|---|---|---|---|
| 5,350,957 A | * | 9/1994 | Cooper et al. ............... | 327/427 |
| 5,461,265 A | * | 10/1995 | Kunihisa et al. ............. | 307/98 |
| 5,812,939 A | * | 9/1998 | Kohama ...................... | 455/78 |
| 5,818,283 A | * | 10/1998 | Tonami et al. ............... | 327/436 |
| 5,883,541 A | * | 3/1999 | Tahara et al. ................ | 327/434 |
| 5,945,867 A | * | 8/1999 | Uda et al. .................... | 327/431 |
| 5,990,580 A | * | 11/1999 | Weigand ...................... | 307/125 |
| 6,064,362 A | * | 5/2000 | Brownlow et al. ............ | 345/98 |
| 6,489,856 B1 | * | 12/2002 | Weigand ...................... | 333/81 R |
| 6,545,886 B1 | * | 4/2003 | Ireland ........................ | 363/56.02 |
| 6,642,578 B1 | * | 11/2003 | Arnold et al. ................ | 257/341 |
| 6,803,680 B1 | * | 10/2004 | Brindle et al. ............... | 307/115 |

FOREIGN PATENT DOCUMENTS

| | | |
|---|---|---|
| JP | 4845545 | 6/1973 |
| JP | 4854857 | 8/1973 |
| JP | 870245 | 3/1996 |
| JP | 955682 | 2/1997 |
| JP | 9181588 | 7/1997 |
| JP | 10242829 | 9/1998 |
| JP | 2000223902 | 8/2000 |

* cited by examiner

*Primary Examiner*—Tuan T. Lam
*Assistant Examiner*—Hiep Nguyen
(74) *Attorney, Agent, or Firm*—Stevens, Davis, Miller & Mosher, LLP

(57) ABSTRACT

A field effect transistor switch circuit may include: (1) first, second, and third switch terminals; (2) a first field effect transistor, a pair of the main electrodes of which are connected respectively to the first switch terminal and the second switch terminal; and (3) a second field effect transistor, a pair of the main electrodes of which are connected respectively to the first switch terminal and the third switch terminal. A first resistor is connected between a control electrode and any one of the pair of the main electrodes of the first field effect transistor, and a second resistor is connected between a control electrode and any one of the pair of the main electrodes of the second field effect transistor.

20 Claims, 21 Drawing Sheets

FIELD EFFECT TRANSISTOR SWITCH CIRCUIT

BACKGROUND OF THE INVENTION

1. Field of the Invention

The present invention relates generally to a field effect transistor switch circuit and, in particular, to a field effect transistor switch circuit for high frequency and high power applications.

2. Related Art of the Invention

Switches composed of MES field effect transistors are widely used in high frequency and high power applications. In these switches, signal lines are switched using the ON and OFF resistances of the transistors.

In general, MES field effect transistors are of depletion type. That is, their threshold voltage Vth below which the drain current becomes zero is negative. Accordingly, when the gate-source potential difference Vgs is 0 V, such a field effect transistor is ON. In order for the field effect transistor to go OFF, a voltage below the threshold voltage Vth needs to be applied. In prior art apparatuses, this voltage has generally been obtained from a negative power supply. However, in another prior art apparatus, internal self-bias effect of a field effect transistor is utilized to generate a reference bias voltage, whereby the necessity of an external bias circuit is avoided (Japanese Laid-Open Patent Publication No. H9-181588).

A DPDT (double pole double throw) switch which needs no external bias circuit is described below in detail as an example of a prior art field effect transistor switch circuit.

FIG. 5 is a circuit diagram showing a DPDT switch which needs no external bias circuit. The DPDT switch comprises four switch terminals, which are two switch input terminals 1 and 3 and two switch output terminals 2 and 4. The switch input terminals 1 and 3 receive input signals IN1 and IN2, respectively. The switch output terminals 2 and 4 provide output signals OUT1 and OUT2, respectively.

Four sets of field effect transistors 5a–5d, 6a–6d, 7a–7d, 8a–8d are arranged respectively between the switch input terminals 1 and 3 and the switch output terminals 2 and 4. Voltages of +Vc and 0 V are selectively applied as control voltages Vc1 and Vc2 to the control terminals 21 and 22, whereby the gate voltages of the field effect transistors 5a–5d, 6a–6d, 7a–7d, 8a–8d are controlled. As a result, the field effect transistors 5a–5d, 6a–6d, 7a–7d, 8a–8d go ON and OFF, and thereby switch the signal lines. In this example, the sources of the field effect transistors 5a–5d, 6a–6d, 7a–7d, 8a–8d are oriented toward the switch input terminal 1 or 3, while the drains are oriented toward the switch output terminal 2 or 4.

Two signal path configurations are available in this apparatus. In a first path configuration, the input signal IN1 inputted to the switch input terminal 1 is outputted as the output signal OUT1 from the switch output terminal 2, while the input signal IN2 inputted to the switch input terminal 3 is outputted as the output signal OUT2 from the switch output terminal 4.

In a second path configuration, the input signal IN1 inputted to the switch input terminal 1 is outputted as the output signal OUT2 from the switch output terminal 4, while the input signal IN2 inputted to the switch input terminal 3 is outputted as the output signal OUT1 from the switch output terminal 2.

Resistors 9a–9d, 10a–10d, 11a–11d, 12a–12d are connected respectively between the gates of the field effect transistors 5a–5d, 6a–6d, 7a–7d, 8a–8d and the control terminal 21 or 22.

DC cut capacitors 13, 14, 15, 16 are connected respectively between: the field effect transistors 5a, 5d, 6a, 6d, 7a, 7d, 8a, 8d; and the switch input terminals 1 and 3 and the switch output terminals 2 and 4.

In FIG. 5, when voltages of +Vc and 0 V are applied respectively as the control voltages Vc1 and Vc2 to the control terminals 21 and 22, relations between potentials at various points connected to the control terminal 21 or 22 become as described below.

When the potentials at the control terminals 21 and 22 are denoted by V(Vc1) and V(Vc2), respectively, the voltage condition is expressed as follows.

$$+Vc=V(Vc1)$$

$$0V=V(Vc2)$$

The gate potential $V(G8d)$ of the field effect transistor $8d$ is lower than the potential $V(Vc1)$ of the control terminal 21 because of the voltage drop across the resistor $12d$.

In the field effect transistor $8d$, a forward current flows through the P-N junction from the gate $G8d$ to the source $S8d$, thereby generates a voltage drop. In the field effect transistor $5a$, a reverse current flows through the P-N junction from the source $S5a$ to the gate $G5a$, thereby generates a voltage drop.

Further, a resistor $9a$ generates a voltage drop between the gate $G5a$ of the field effect transistor $5a$ and the control terminal 22.

These relations are summarized by the following single expression.

$$+Vc=V(Vc1)>V(G8d)>V(S8d)=V(S5a)>V(G5a)>V(Vc2)=0V$$

Here, symbol $V(S8d)$ denotes the source potential of the field effect transistor $8d$. Symbol $V(S5a)$ denotes the source potential of the field effect transistor $5a$. Symbol $V(G5a)$ denotes the gate potential of the field effect transistor $5a$.

In such a bias condition, in the field effect transistor $8d$, a forward current flows through the P-N junction because of the forward bias. In the field effect transistor $5a$, a reverse current flows through the P-N junction because of the reverse bias.

However, a DC cut capacitor 13 is connected to the switch input terminal 1. Accordingly, the forward current equals the reverse current. Further, if a forward bias and a reverse bias having the same voltage are applied to P-N junctions, the forward current is substantially larger than the reverse current. Accordingly, when the same current flows through the P-N junctions, the voltage drop is substantially larger in the reverse bias than in the forward bias. That is, $$V(G8d)-V(S8d)<<V(S5a)-V(G5a)$$

Thus, using $$V(S5a)=V(S8d)$$

the following relation is obtained $$V(S5a)\approx V(G8d)$$

Since the currents flowing through the P-N junctions are sufficiently small, the voltage drops in the resistors $9a$ and $12d$ are negligibly small. Thus, $$V(G8d)\approx Vc \text{ and } V(G5a)\approx 0V$$

Accordingly, $$V(S5a) \approx Vc$$

As a result, the field effect transistor 5a goes OFF, while the field effect transistor 8d goes ON.

Similarly, the field effect transistors 5b–5d and 7a–7d goes OFF, while the field effect transistors 6a–6d and 8a–8c goes ON.

As such, only the control voltages Vc1 and Vc2 cause the field effect transistors 5a–5d, 6a–6d, 7a–7d, 8a–8d to serve as switching elements.

Numeral D5a indicates the drain of the field effect transistor 5a. Numerals D5d, S5d, and G5d indicate respectively the drain, source, and gate of the field effect transistor 5d. Numerals D6a, S6a, and G6a indicate respectively the drain, source, and gate of the field effect transistor 6a. Numerals D6d, S6d, and G6d indicate respectively the drain, source, and gate of the field effect transistor 6d. Numerals D7a, S7a, and G7a indicate respectively the drain, source, and gate of the field effect transistor 7a. Numerals D7d, S7d, and G7d indicate respectively the drain, source, and gate of the field effect transistor 7d. Numerals D8a, S8a, and G8a indicate respectively the drain, source, and gate of the field effect transistor 8a. Numeral D8d indicates the drain of the field effect transistor 8d.

A technical problem in the prior art is that the depletion layer expands due to electron trapping effect, whereby the DC potentials of the switch input terminals 1 and 3 exceed +Vc+Vth. In case that the DC potentials of the switch input terminals 1 and 3 rise to this level, the field effect transistors do not go ON even when the gate potentials are set at the voltage +Vc.

The problem that the DC potentials of the switch input terminals 1 and 3 rise to this level is described below in detail. In the field effect transistor switch circuit shown in FIG. 5, all the field effect transistors 5a–5d, 6a–6d, 7a–7d, 8a–8d have the same characteristics. Further, the gate-source capacitance equals the gate-drain capacitance in each field effect transistor 5a–5d, 6a–6d, 7a–7d, 8a–8d. The gate of each field effect transistor 5a–5d, 6a–6d, 7a–7d, 8a–8d is biased through a resistor 9a–9d, 10a–10d, 11a–11d, 12a–12d having a high resistance. Thus, the bias circuit equivalently has a high impedance for high frequency.

When voltages of +Vc and 0 V are applied respectively as the control voltages Vc1 and Vc2 to the control terminals 21 and 22, the field effect transistors 5a–5d shown in FIG. 5 go OFF. These field effect transistors 5a–5d in the OFF state are equivalent to a serial connection of eight capacitances composed of the gate-source capacitances C and the gate-drain capacitances C. FIG. 6 schematically shows these capacitances C and the gate resistors 9a–9d.

When a high frequency signal having an amplitude of Vin is inputted as the input signal IN1 to the switch input terminal 1, the high frequency signal is divided by the gate-source capacitances C and the gate-drain capacitances C of the field effect transistors 5a–5d. As a result, the time-dependent changes in the potentials V(S5a), V(G5a), and V(D5a) of the source S5a, the gate G5a, and the drain D5a of the field effect transistor 5a are as shown in FIG. 7. The vertical axis in FIG. 7 indicates the potential at each measurement point, while the horizontal axis indicates the time.

In the field effect transistor 5a, the bias conditions at t=t1 and at t=t2 are as shown in FIGS. 8A and 8B, respectively. When the amplitude of the input signal is large, the field effect transistor 5a goes under a strong reverse bias condition at t=t1 and t=t2.

FIGS. 9A and 9B are cross sectional views of the structure of the field effect transistor 5a which is the first-stage field effect transistor relative to the switch input terminal 1 among the field effect transistors 5a–5d in the OFF state. In FIGS. 9A and 9B, mark "+" indicates a hole, while encircled mark "−" indicates an electron.

As shown in FIG. 9A, when a voltage of 0 V is applied to the gate, the depletion layer under the gate extends to the channel, whereby the field effect transistor 5a go OFF. However, when a signal having a large amplitude is applied to the source terminal and when the P-N junction thereby goes under a reverse bias condition as described above, a leak current flows from the gate, whereby electrons are trapped in the surface potentials (traps) between the gate and the source and between the gate and the drain. The depletion layer expands proportionally to the number of electrons. FIG. 9B illustrates the expanded depletion layer. The field effect transistor 5a immediately adjacent to the switch input terminal receives a signal having the largest amplitude. This causes a large reverse bias, and hence a wide expansion in the depletion layer.

Even when the depletion layer is in the expanded state, the field effect transistors 5a–5d are OFF. Accordingly, the field effect transistors 5a–5d are equivalent to a serial connection of eight capacitances composed of the gate-source capacitances and the gate-drain capacitances.

However, since the depletion layer is in the expanded state as described above, the gate-source capacitance of the field effect transistor 5a is smaller than the other gate-source capacitances and the gate-drain capacitances. The capacitance of each portion with an unexpanded depletion layer is C, while the capacitance of the portion with an expanded depletion layer is assumed to (½)C for simplicity. FIG. 10 schematically shows these capacitances and the resistors 9a–9d.

In such a situation, when a high frequency signal having an amplitude of Vin is inputted as the input signal IN1 to the switch input terminal 1, the time-dependent changes in the potentials V(S5a), V(G5a), and V(D5a) of the source S5a, the gate G5a, and the drain D5a of the field effect transistor 5a are as shown in FIG. 11. In this case, the gate-source capacitance of the field effect transistor 5a equals ½ of each of the gate-drain capacitances and the gate-source capacitances of the other field effect transistors 5b–5d. Accordingly, in contrast to FIG. 7, the voltage drop of the capacitance between the source S5a and the gate G5a of the field effect transistor 5a is twice value of each of the other capacitances.

The potentials of the source S5a, the gate G5a, and the drain D5a of the field effect transistor 5a at t=t1 and t2 behave as follows. As shown in FIG. 12, when the amplitude of the input signal is small, the field effect transistor 5a remains OFF. In contrast, when the amplitude of the input signal is large, the field effect transistor 5a goes ON. When the field effect transistor 5a goes ON, electric charge moves from the DC cut capacitor 14 to the DC cut capacitor 13. As a result, the DC cut capacitor 13 is charged up, and hence the DC potential of the switch input terminal 1 rises.

The potential of the switch input terminal 1 is at approximately Vc in the original state. Accordingly, when the potential rises slightly, the potential exceeds Vc immediately. Even when the state V(S5a)−Vc>Vth is reached, the field effect transistors 8a–8d do not go ON in case that Vc1=+Vc.

Accordingly, in this prior art field effect transistor switch circuit, when a signal having a large amplitude is inputted, the depletion layer expands due to electron trapping effect, whereby unbalance occurs between the DC cut capacitors 13 and 14. This causes a rise in the DC potential of the switch input terminal 1, and thereby disables ON/OFF switching operations which are the basic operations of a switch.

As such, the gate-source capacitance of the field effect transistor in the OFF state decreases due to the expansion of the depletion layer, whereas the gate-drain capacitance does not decrease regardless of the expansion of the depletion layer. This fact is described below. In FIG. 5, it is assumed that the field effect transistors 8a–8d are OFF and that the field effect transistors 5a–5d are ON. In this case, the field effect transistors 8a–8d are approximated as a serial connection circuit of capacitances. Assuming that the depletion layers are normal, the potentials V(S8d), V(G8d), V(D8d) are as shown in FIG. 13. At t=t2, the gate-drain voltage is $$Vgd=3-(\tfrac{1}{8})Va$$

while the gate-source voltage is $$Vgs=3+(\tfrac{1}{8})Va$$

That is, Vgs>Vgd. This indicates that the depletion layer expands more in the gate-source region than in the gate-drain region.

SUMMARY OF THE INVENTION

The invention has been devised in order to resolve the above-mentioned problems. An object of the invention is to provide a field effect transistor switch circuit in which the DC potential of the switch input terminal does not rise, whereby ON/OFF switching is performed normally, even when a signal having a large amplitude is inputted to the switch input terminal, thereby the depletion layer expands due to electron trapping effect.

A first aspect of the invention is a field effect transistor switch circuit comprising: first, second, and third switch terminals; a first field effect transistor a pair of the main electrodes of which are connected respectively to the first switch terminal and the second switch terminal; a second field effect transistor a pair of the main electrodes of which are connected respectively to the first switch terminal and the third switch terminal; a first resistor connected between the control electrode and any one of a pair of the main electrodes of the first field effect transistor; and a second resistor connected between the control electrode and any one of a pair of the main electrodes of the second field effect transistor.

According to this configuration, the control electrode voltages of the first and second field effect transistors are controlled, whereby the ON/OFF states of the first and second field effect transistors are controlled. As a result, switching is performed between a first state and a second state. In the first state, the electric conduction between the first switch terminal and the second switch terminal is closed, while the electric conduction between the first switch terminal and the third switch terminal is open. In the second state, the electric conduction between the first switch terminal and the second switch terminal is open, while the electric conduction between the first switch terminal and the third switch terminal is closed.

When the first switch terminal is used as a switch input terminal, the second and third switch terminals serve as switch output terminals. In contrast, when the second and third switch terminals are used as switch input terminals, the first switch terminal serves as a switch output terminal. A pair of the main electrodes of the field effect transistor are composed of a source and a drain, while the control electrode is composed of a gate. The electrodes connected to the first, second, and third switch terminals may be either sources or drains of the first and second field effect transistors. This is because field effect transistors used in switching application have a symmetric configuration essentially, and hence the source and the drain are equivalent to each other. Accordingly, although one end of each of the first and second resistors is connected to the gate of each of the first and second field effect transistors, respectively, the other end may be connected to either the source or the drain.

Each of the first and second resistors is connected between the control electrode and any one of a pair of the main electrodes of each of the first and second field effect transistors. As a result, the potentials of the first, second, and third switch terminals are fixed by the first and second resistors. By virtue of this, the DC potentials of the first, second, and third switch terminals do not rise, whereby ON/OFF switching is performed normally, even when a signal having a large amplitude is inputted to any one of the first, second, and third switch terminals, thereby the depletion layer of any one of the first and second field effect transistors expands due to electron trapping effect.

Thus, without increasing the number of serial field effect transistor stages (that is, using the same number of stages), ON/OFF switching is performed normally even for input signals having larger amplitudes. Resistors occupy a smaller area on the circuit chip than field effect transistors and capacitances. Thus, the overall size is reduced.

The reason why the chip size is reduced in comparison with prior art field effect transistor switch circuits for large amplitudes is as follows. In prior art field effect transistor switch circuits for large amplitudes, the number of field effect transistor stages has been increased, or alternatively, a capacitance occupying a large area has been connected between the gate and the switch input terminal. In contrast, in the invention, a resistor having a small area is connected in order to process large amplitudes.

In the above-mentioned configuration, each of the first and second field effect transistors may be composed of a serial circuit of a plurality of field effect transistors.

According to this configuration, since each of the first and second field effect transistors is composed of a serial circuit of a plurality of field effect transistors, ON/OFF switching is performed normally even for input signals having larger amplitudes.

In the above-mentioned configuration, a correction capacitance for correcting unbalance of equivalent capacitances between the control electrode and each of a pair of the main electrodes of the field effect transistor during the OFF state of the field effect transistor may be provided between the control electrode and any one of a pair of the main electrodes of the field effect transistor.

According to this configuration, unbalance of equivalent capacitances is corrected between the control electrode and each of a pair of the main electrodes of the field effect transistor during the OFF state of the field effect transistor. By virtue of this, even when the depletion layer of the field effect transistor expands, the DC potential of the switch terminal do not rise, whereby ON/OFF switching is performed normally.

In the above-mentioned configuration, the correction capacitance is preferably set smaller than the depletion layer capacitance during the ON-state of the field effect transistor, and larger than the depletion layer capacitance during the OFF-state.

According to this configuration, signal leakage to the OFF side is suppressed, whereby ON/OFF switching is performed normally.

A second aspect of the invention is a field effect transistor switch circuit comprising: first and second switch terminals; a ground terminal; a first field effect transistor a pair of the main electrodes of which are connected respectively to the first switch terminal and the second switch terminal; a second field effect transistor a pair of the main electrodes of which are connected respectively to the first switch terminal and the ground terminal; a first resistor connected between the control electrode and any one of a pair of the main electrodes of the first field effect transistor; and a second resistor connected between the control electrode and any one of a pair of the main electrodes of the second field effect transistor.

According to this configuration, the control electrode voltages of the first and second field effect transistors are controlled, whereby the ON/OFF states of the first and second field effect transistors are controlled. As a result, switching is performed between a first state and a second state. In the first state, the electric conduction between the first switch terminal and the second switch terminal is closed, while the electric conduction between the first switch terminal and the ground terminal is open. In the second state, the electric conduction between the first switch terminal and the second switch terminal is open, while the electric conduction between the first switch terminal and the ground terminal is closed.

When the first switch terminal is used as a switch input terminal, the second switch terminal serves as a switch output terminal. In contrast, when the second switch terminal is used as a switch input terminal, the first switch terminal serves as a switch output terminal. A pair of the main electrodes the field effect transistor are composed of a source and a drain, while the control electrode is composed of a gate. The electrodes connected to the first and second switch terminals and the ground terminal may be either sources or drains of the first and second field effect transistors. This is because field effect transistors used in switching application have a symmetric configuration essentially, and hence the source and the drain are equivalent to each other. Accordingly, although one end of each of the first and second resistors is connected to the gate of each of the first and second field effect transistors, respectively, the other end may be connected to either the source or the drain.

Each of the first and second resistors is connected between the control electrode and any one of a pair of the main electrodes of each of the first and second field effect transistors. As a result, the potentials of the first and second switch terminals are fixed by the first and second resistors. By virtue of this, the DC potentials of the first and second switch terminals do not rise, whereby ON/OFF switching is performed normally, even when a signal having a large amplitude is inputted to any one of the first and second switch terminals, thereby the depletion layer of any one of the first and second field effect transistors expands due to electron trapping effect.

Thus, without increasing the number of serial field effect transistor stages (that is, using the same number of stages), ON/OFF switching is performed normally even for input signals having larger amplitudes. Resistors occupy a smaller area on the circuit chip than field effect transistors and capacitances. Thus, the overall size is reduced.

In the above-mentioned configuration, each of the first and second field effect transistors may be composed of a serial circuit of a plurality of field effect transistors.

According to this configuration, since each of the first and second field effect transistors is composed of a serial circuit of a plurality of field effect transistors, ON/OFF switching is performed normally even for input signals having larger amplitudes.

In the above-mentioned configuration, a correction capacitance for correcting unbalance of equivalent capacitances between the control electrode and each of a pair of the main electrodes of the field effect transistor during the OFF state of the field effect transistor may be provided between the control electrode and any one of a pair of the main electrodes of the field effect transistor.

According to this configuration, unbalance of equivalent capacitances is corrected between the control electrode and each of a pair of the main electrodes of the field effect transistor during the OFF state of the field effect transistor. By virtue of this, even when the depletion layer of the field effect transistor expands, the DC potential of the switch terminal do not rise, whereby ON/OFF switching is performed normally.

In the above-mentioned configuration, the correction capacitance is preferably set smaller than the depletion layer capacitance during the ON-state of the field effect transistor, and larger than the depletion layer capacitance during the OFF-state.

According to this configuration, signal leakage to the OFF side is suppressed, whereby ON/OFF switching is performed normally.

A third aspect of the invention is a field effect transistor switch circuit comprising: first, second, third, and fourth switch terminals; a first field effect transistor a pair of the main electrodes of which are connected respectively to the first switch terminal and the second switch terminal; a second field effect transistor a pair of the main electrodes of which are connected respectively to the second switch terminal and the third switch terminal; a third field effect transistor a pair of the main electrodes of which are connected respectively to the third switch terminal and the fourth switch terminal; a fourth field effect transistor a pair of the main electrodes of which are connected respectively to the fourth switch terminal and the first switch terminal; a first resistor connected between the control electrode and any one of a pair of the main electrodes of the first field effect transistor; a second resistor connected between the control electrode and any one of a pair of the main electrodes of the second field effect transistor; a third resistor connected between the control electrode and any one of a pair of the main electrodes of the third field effect transistor; and a fourth resistor connected between the control electrode and any one of a pair of the main electrodes of the fourth field effect transistor.

According to this configuration, the control electrode voltages of the first, second, third, and fourth field effect transistors are controlled, whereby the ON/OFF states of the first, second, third, and fourth field effect transistors are controlled. As a result, the electric conduction between the first, second, third, and fourth switch terminals is switched arbitrarily.

When the first and third switch terminals are used as switch input terminals, the second and fourth switch terminals serve as switch output terminals. In contrast, when the second and fourth switch terminals are used as switch input terminals, the first and third switch terminal serve as switch output terminals. Further, when any one of the first through fourth switch terminal is used as a switch input terminal, the other switch terminals serve as switch output terminals. In contrast, when any one of the first through fourth switch terminal is used as a switch output terminal, the other switch terminals serve as switch input terminals. A pair of the main electrodes the field effect transistor are composed of a source and a drain, while the control electrode is composed of a gate. The electrodes connected to the first through fourth switch terminals may be either sources or drains of the first through fourth field effect transistors. This is because field effect transistors used in switching application have a symmetric configuration essentially, and hence the source and the drain are equivalent to each other. Accordingly, although one end of each of the first, second, third, and fourth resistors is connected to the gate of each of the first, second, third, and fourth field effect transistors, respectively, the other end may be connected to either the source or the drain.

Each of the first, second, third, and fourth resistors is connected between the control electrode and any one of a pair of the main electrodes of each of the first, second, third, and fourth field effect transistors. As a result, the potentials of the first, second, third, and fourth switch terminals are fixed by the first, second, third, and fourth resistors. By virtue of this, the DC potentials of the first, second, third, and fourth switch terminals do not rise, whereby ON/OF switching is performed normally, even when a signal having a large amplitude is inputted to any one of the first, second, third, and fourth switch terminals, thereby the depletion layer of any one of the first, second, third, and fourth field effect transistors expands due to electron trapping effect.

Thus, without increasing the number of serial field effect transistor stages (that is, using the same number of stages), ON/OFF switching is performed normally even for input signals having larger amplitudes. Resistors occupy a smaller area on the circuit chip than field effect transistors and capacitances. Thus, the overall size is reduced.

In the above-mentioned configuration, each of the first, second, third, and fourth field effect transistors may be composed of a serial circuit of a plurality of field effect transistors.

According to this configuration, since each of the first, second, third, and fourth field effect transistors is composed of a serial circuit of a plurality of field effect transistors, ON/OFF switching is performed normally even for input signals having larger amplitudes.

In the above-mentioned configuration, a correction capacitance for correcting unbalance of equivalent capacitances between the control electrode and each of a pair of the main electrodes of the field effect transistor during the OFF state of the field effect transistor maybe provided between the control electrode and any one of a pair of the main electrodes of the field effect transistor.

According to this configuration, unbalance of equivalent capacitances is corrected between the control electrode and each of a pair of the main electrodes of the field effect transistor during the OFF state of the field effect transistor. By virtue of this, even when the depletion layer of the field effect transistor expands, the DC potential of the switch terminal do not rise, whereby ON/OFF switching is performed normally.

In the above-mentioned configuration, the correction capacitance is preferably set smaller than the depletion layer capacitance during the ON-state of the field effect transistor, and larger than the depletion layer capacitance during the OFF-state.

According to this configuration, signal leakage to the OFF side is suppressed, whereby ON/OFF switching is performed normally.

A fourth aspect of the invention is a field effect transistor switch circuit comprising: first, second, and third switch terminals; a first field effect transistor a pair of the main electrodes of which are connected respectively to the first switch terminal and the second switch terminal; a second field effect transistor a pair of the main electrodes of which are connected respectively to the first switch terminal and the third switch terminal; a first correction capacitance which is connected between the control electrode and any one of a pair of the main electrodes of the first field effect transistor and thereby corrects unbalance of equivalent capacitances between the control electrode and each of a pair of the main electrodes of the first field effect transistor during the OFF state of the first field effect transistor; and a second correction capacitance which is connected between the control electrode and any one of a pair of the main electrodes of the second field effect transistor and thereby corrects unbalance of equivalent capacitances between the control electrode and each of a pair of the main electrodes of the second field effect transistor during the OFF state of the second field effect transistor.

According to this configuration, correction capacitances are provided in place of the resistors of the first invention, whereby unbalance of equivalent capacitances is corrected between the control electrode and each of a pair of the main electrodes of the field effect transistor during the OFF state of the field effect transistor. By virtue of this, even when the depletion layer of the field effect transistor expands, the DC potential of the switch terminal do not rise, whereby ON/OFF switching is performed normally. The effects of the first invention other than those obtained by virtue of the resistors are similarly obtained herein.

In the above-mentioned configuration, each of the first and second field effect transistors may be composed of a serial circuit of a plurality of field effect transistors.

According to this configuration, since each of the first and second field effect transistors is composed of a serial circuit of a plurality of field effect transistors, ON/OFF switching is performed normally even for input signals having larger amplitudes.

In the above-mentioned configuration, the correction capacitance is preferably set smaller than the depletion layer capacitance during the ON-state of the field effect transistor, and larger than the depletion layer capacitance during the OFF-state.

According to this configuration, signal leakage to the OFF side is suppressed, whereby ON/OFF switching is performed normally.

A fifth aspect of the invention is a field effect transistor switch circuit comprising: first and second switch terminals; a ground terminal; a first field effect transistor a pair of the main electrodes of which are connected respectively to the first switch terminal and the second switch terminal; a second field effect transistor a pair of the main electrodes of which are connected respectively to the first switch terminal and the ground terminal; a first correction capacitance which is connected between the control electrode and any one of a pair of the main electrodes of the first field effect transistor and thereby corrects unbalance of equivalent capacitances between the control electrode and each of a pair of the main electrodes of the first field effect transistor during the OFF state of the first field effect transistor; and a second correction capacitance which is connected between the control electrode and any one of a pair of the main electrodes of the second field effect transistor and thereby corrects unbalance of equivalent capacitances between the control electrode and each of a pair of the main electrodes of the second field effect transistor during the OFF state of the second field effect transistor.

According to this configuration, correction capacitances are provided in place of the resistors of the second invention, whereby unbalance of equivalent capacitances is corrected between the control electrode and each of a pair of the main electrodes of the field effect transistor during the OFF state of the field effect transistor. By virtue of this, even when the depletion layer of the field effect transistor expands, the DC potential of the switch terminal do not rise, whereby ON/OFF switching is performed normally. The effects of the second invention other than those obtained by virtue of the resistors are similarly obtained herein.

In the above-mentioned configuration, each of the first and second field effect transistors may be composed of a serial circuit of a plurality of field effect transistors.

According to this configuration, since each of the first and second field effect transistors is composed of a serial circuit of a plurality of field effect transistors, ON/OFF switching is performed normally even for input signals having larger amplitudes.

In the above-mentioned configuration, the correction capacitance is preferably set smaller than the depletion layer capacitance during the ON-state of the field effect transistor, and larger than the depletion layer capacitance during the OFF-state.

According to this configuration, signal leakage to the OFF side is suppressed, whereby ON/OFF switching is performed normally.

A sixth aspect of the invention is a field effect transistor switch circuit comprising: first, second, third, and fourth switch terminals; a first field effect transistor a pair of the main electrodes of which are connected respectively to the first switch terminal and the second switch terminal; a second field effect transistor a pair of the main electrodes of which are connected respectively to the second switch terminal and the third switch terminal; a third field effect transistor a pair of the main electrodes of which are connected respectively to the third switch terminal and the fourth switch terminal; a fourth field effect transistor a pair of the main electrodes of which are connected respectively to the fourth switch terminal and the first switch terminal; a first correction capacitance which is connected between the control electrode and any one of a pair of the main electrodes of the first field effect transistor and thereby corrects unbalance of equivalent capacitances between the control electrode and each of a pair of the main electrodes of the first field effect transistor during the OFF state of the first field effect transistor; a second correction capacitance which is connected between the control electrode and any one of a pair of the main electrodes of the second field effect transistor and thereby corrects unbalance of equivalent capacitances between the control electrode and each of a pair of the main electrodes of the second field effect transistor during the OFF state of the second field effect transistor; a third correction capacitance which is connected between the control electrode and any one of a pair of the main electrodes of the third field effect transistor and thereby corrects unbalance of equivalent capacitances between the control electrode and each of a pair of the main electrodes of the third field effect transistor during the OFF state of the third field effect transistor; and a fourth correction capacitance which is connected between the control electrode and any one of a pair of the main electrodes of the fourth field effect transistor and thereby corrects unbalance of equivalent capacitances between the control electrode and each of a pair of the main electrodes of the fourth field effect transistor during the OFF state of the fourth field effect transistor.

According to this configuration, correction capacitances are provided in place of the resistors of the third invention, whereby unbalance of equivalent capacitances is corrected between the control electrode and each of a pair of the main electrodes of the field effect transistor during the OFF state of the field effect transistor. By virtue of this, even when the depletion layer of the field effect transistor expands, the DC potential of the switch terminal do not rise, whereby ON/OFF switching is performed normally. The effects of the third invention other than those obtained by virtue of the resistors are similarly obtained herein.

In the above-mentioned configuration, each of the first, second, third, and fourth field effect transistors may be composed of a serial circuit of a plurality of field effect transistors.

According to this configuration, since each of the first, second, third, and fourth field effect transistors is composed of a serial circuit of a plurality of field effect transistors, ON/OFF switching is performed normally even for input signals having larger amplitudes.

In the above-mentioned configuration, the correction capacitance is preferably set smaller than the depletion layer capacitance during the ON-state of the field effect transistor, and larger than the depletion layer capacitance during the OFF-state.

According to this configuration, signal leakage to the OFF side is suppressed, whereby ON/OFF switching is performed normally.

DETAILED DESCRIPTION OF THE INVENTION

[Embodiment 1]

Figure 1:
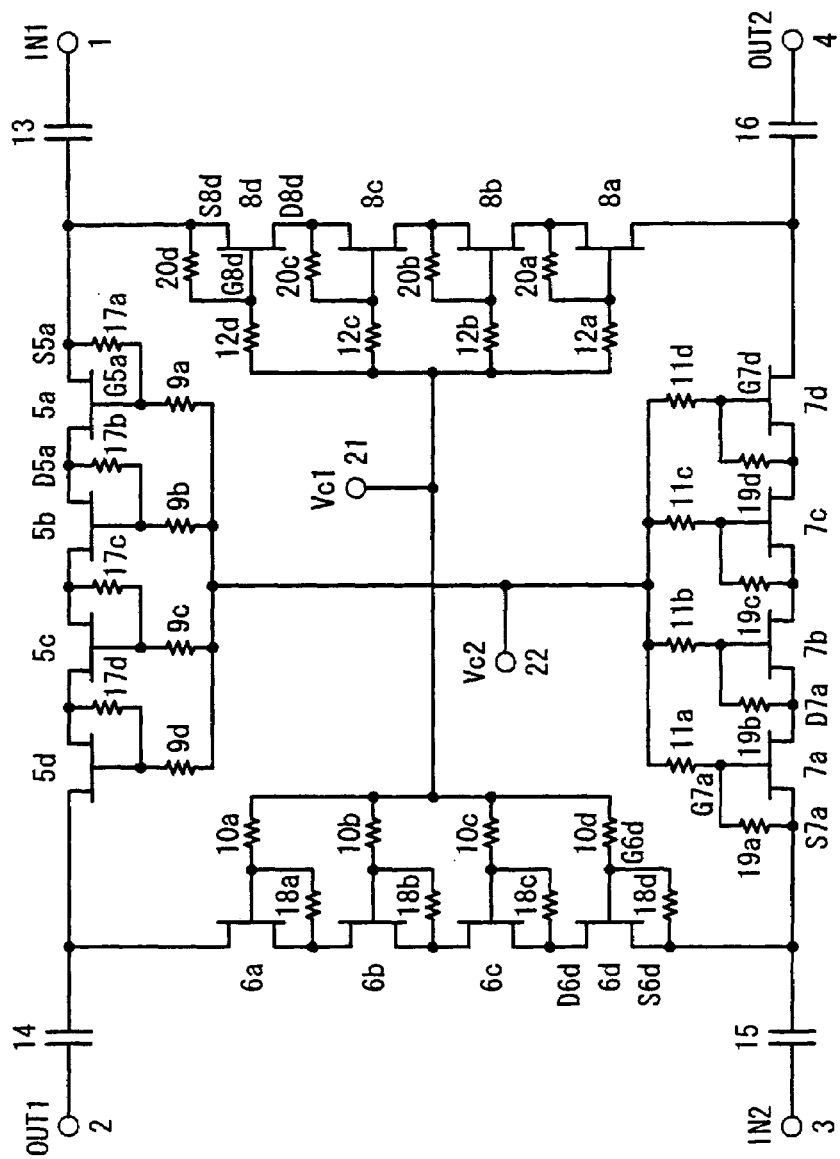
FIG. 1 is an equivalent circuit diagram showing the configuration of a field effect transistor switch circuit according to Embodiment 1 of the invention.
Figure 5:
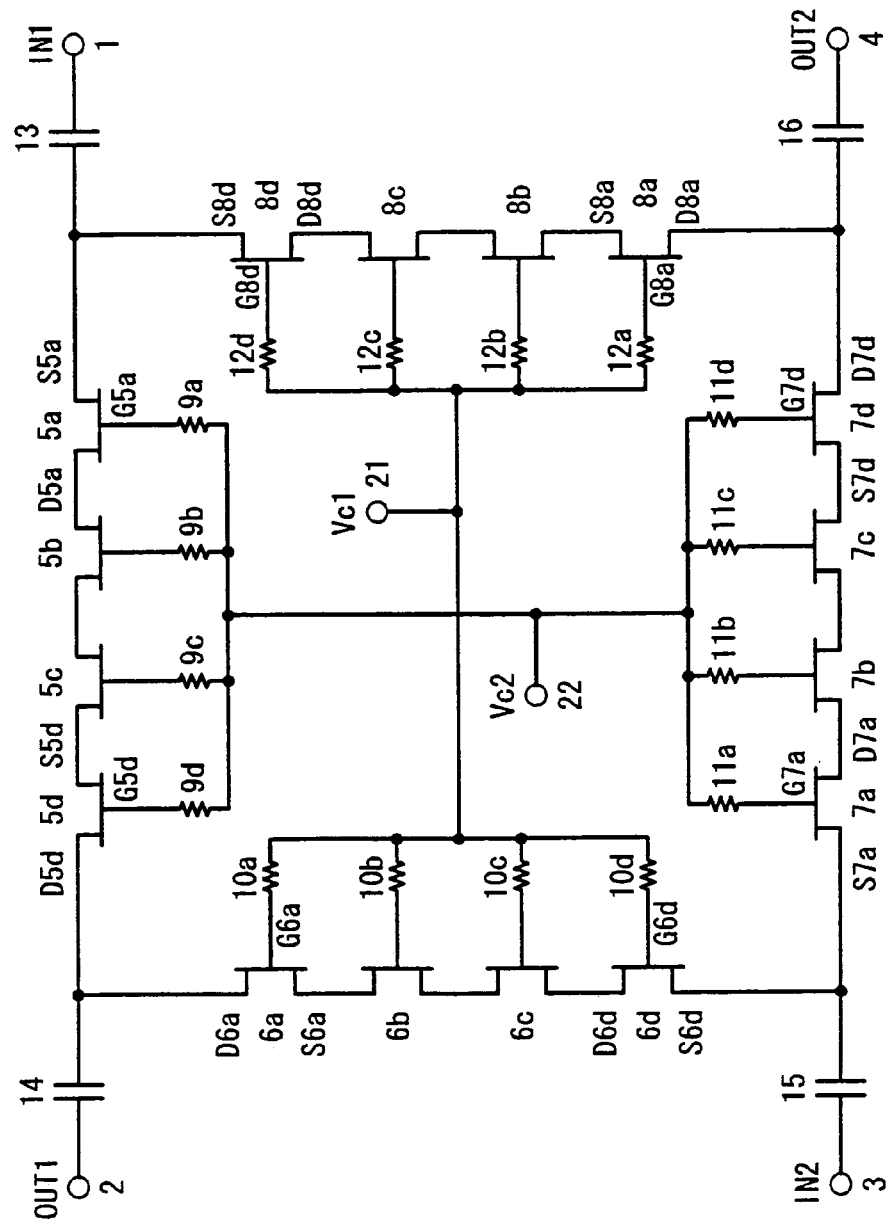
FIG. 5 is an equivalent circuit diagram showing the configuration of a prior art field effect transistor switch circuit.
Figure 6:
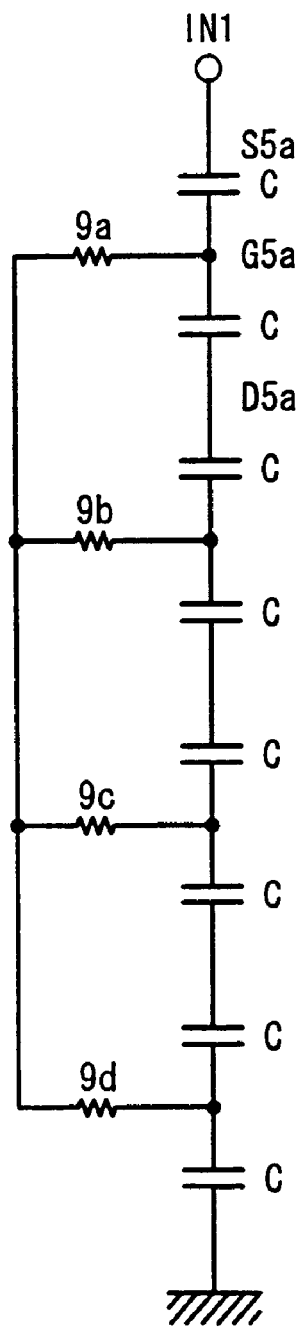
FIG. 6 is an equivalent circuit diagram illustrating the operation of a prior art field effect transistor switch circuit.
Figure 7:
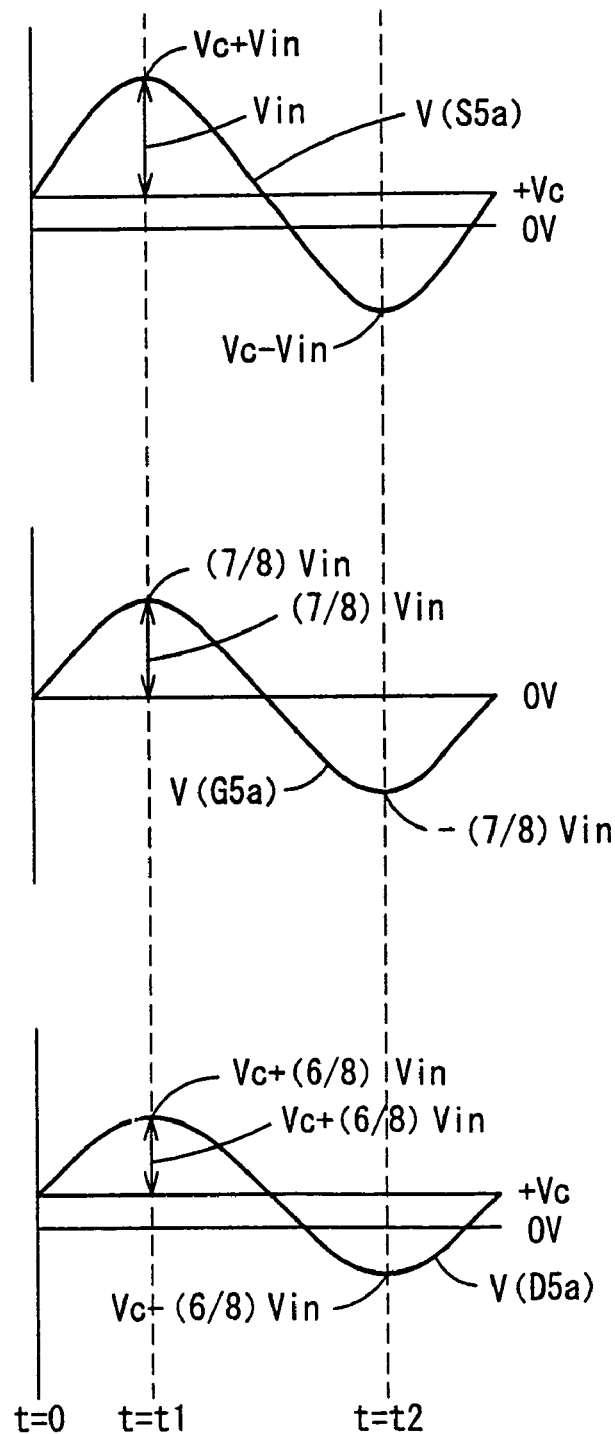
FIG. 7 is a voltage waveform diagram of various measurement points illustrating the operation of a prior art field effect transistor switch circuit.
Figure 8A:
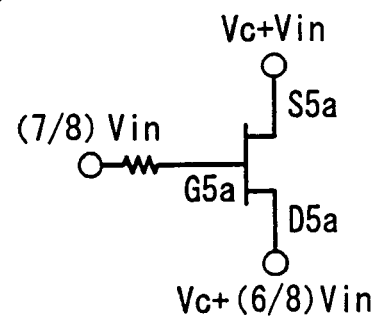
FIG. 8A is a schematic diagram illustrating the bias condition of a field effect transistor $5a$ at t=t1.
Figure 8B:
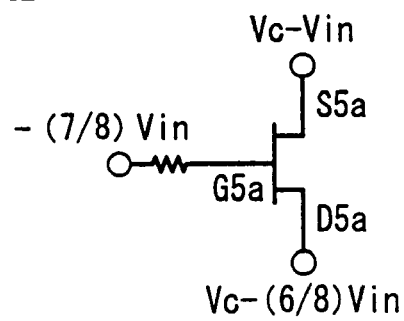
FIG. 8B is a schematic diagram illustrating the bias condition of a field effect transistor $5a$ at t=t2.
Figure 9A:
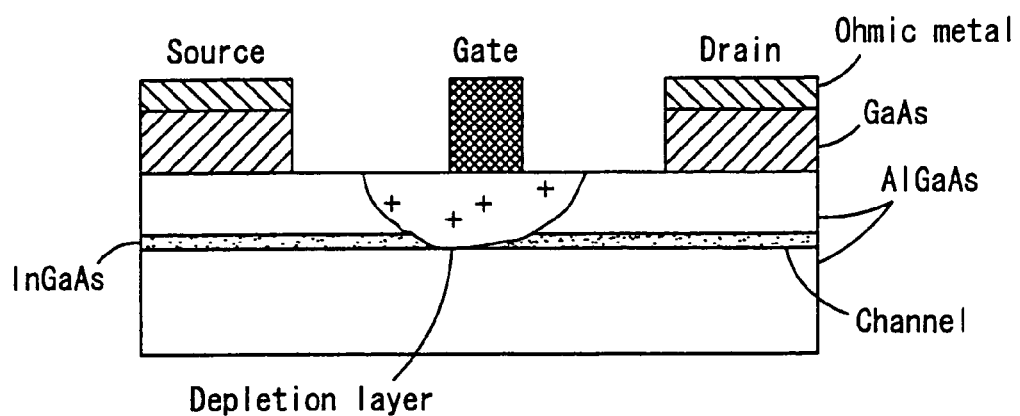
FIG. 9A is a schematic diagram illustrating the ON/OFF operation of a field effect transistor.
Figure 9B:
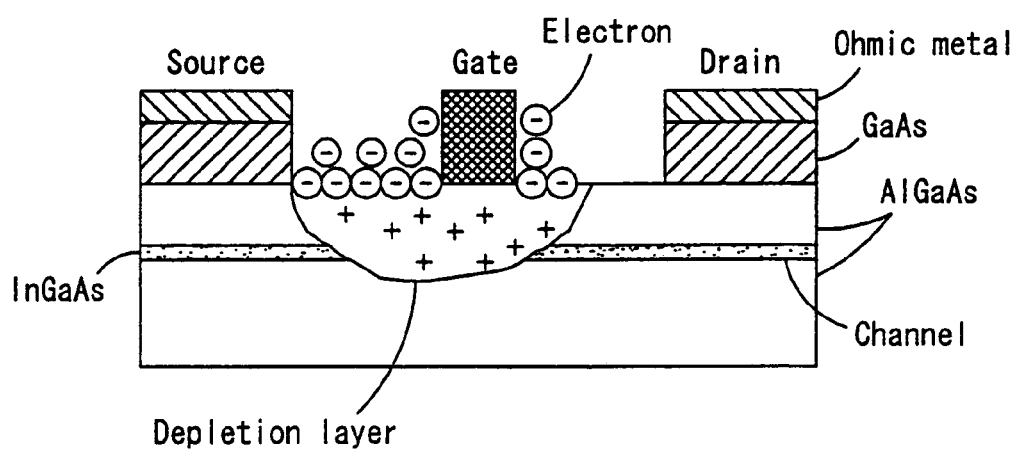
FIG. 9B is a schematic diagram illustrating the ON/OFF operation of a field effect transistor.
Figure 10:
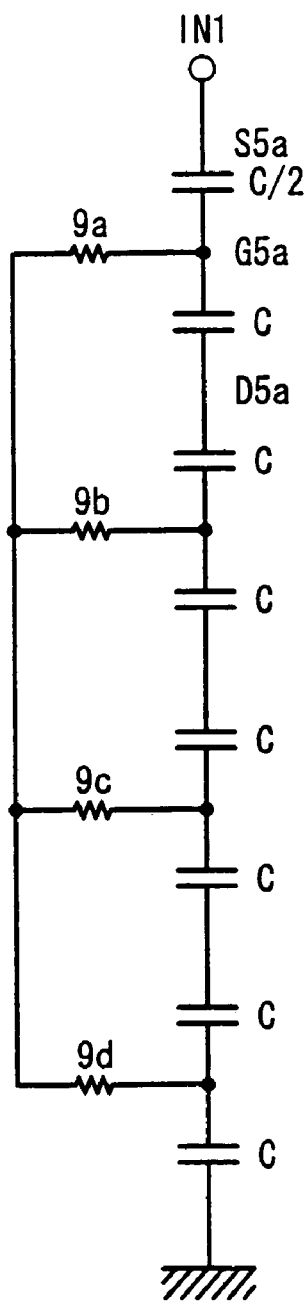
FIG. 10 is an equivalent circuit diagram illustrating the operation of a prior art field effect transistor switch circuit.
Figure 11:
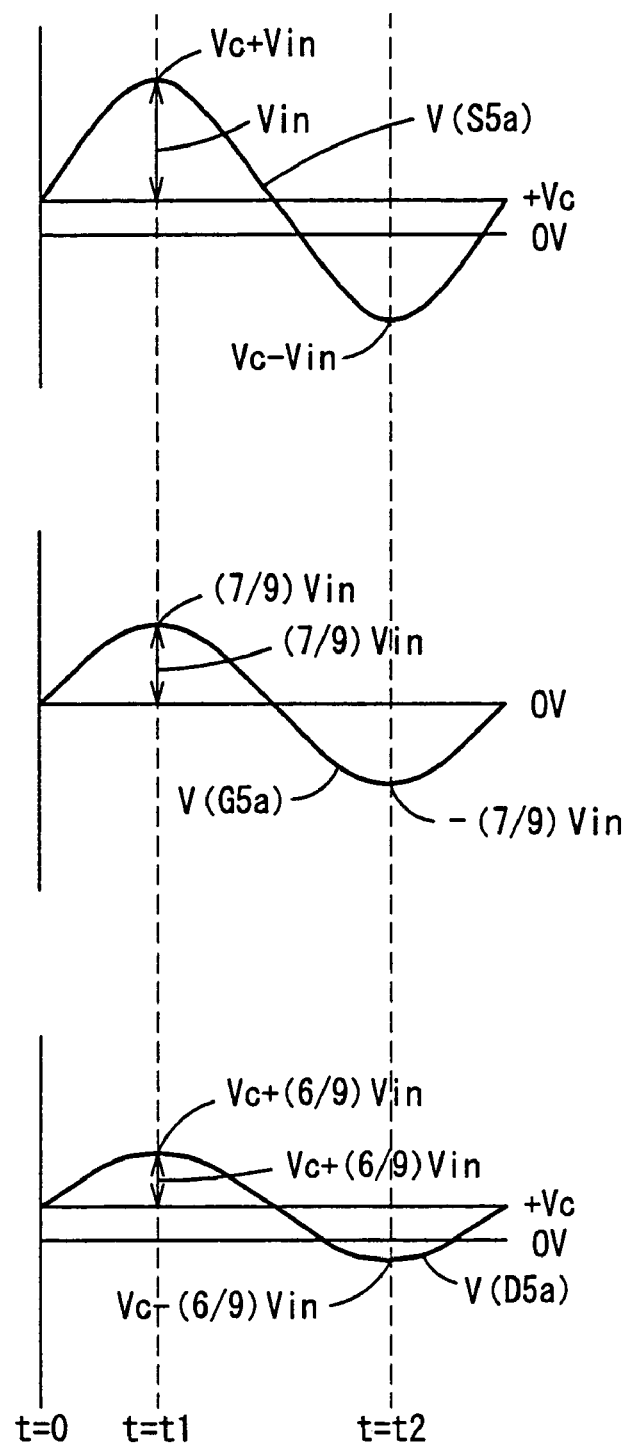
FIG. 11 is a voltage waveform diagram of various measurement points illustrating the operation of a prior art field effect transistor switch circuit.
Figure 12:
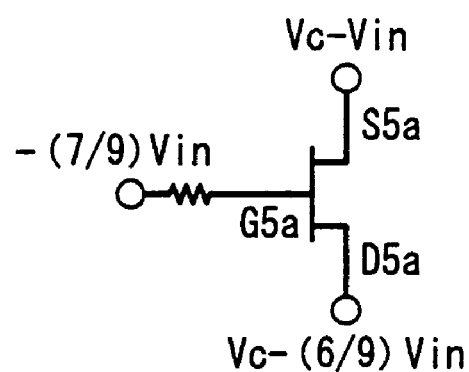
FIG. 12 is a schematic diagram illustrating the bias condition of a field effect transistor $5a$ at t=t1 and t2.
Figure 13:
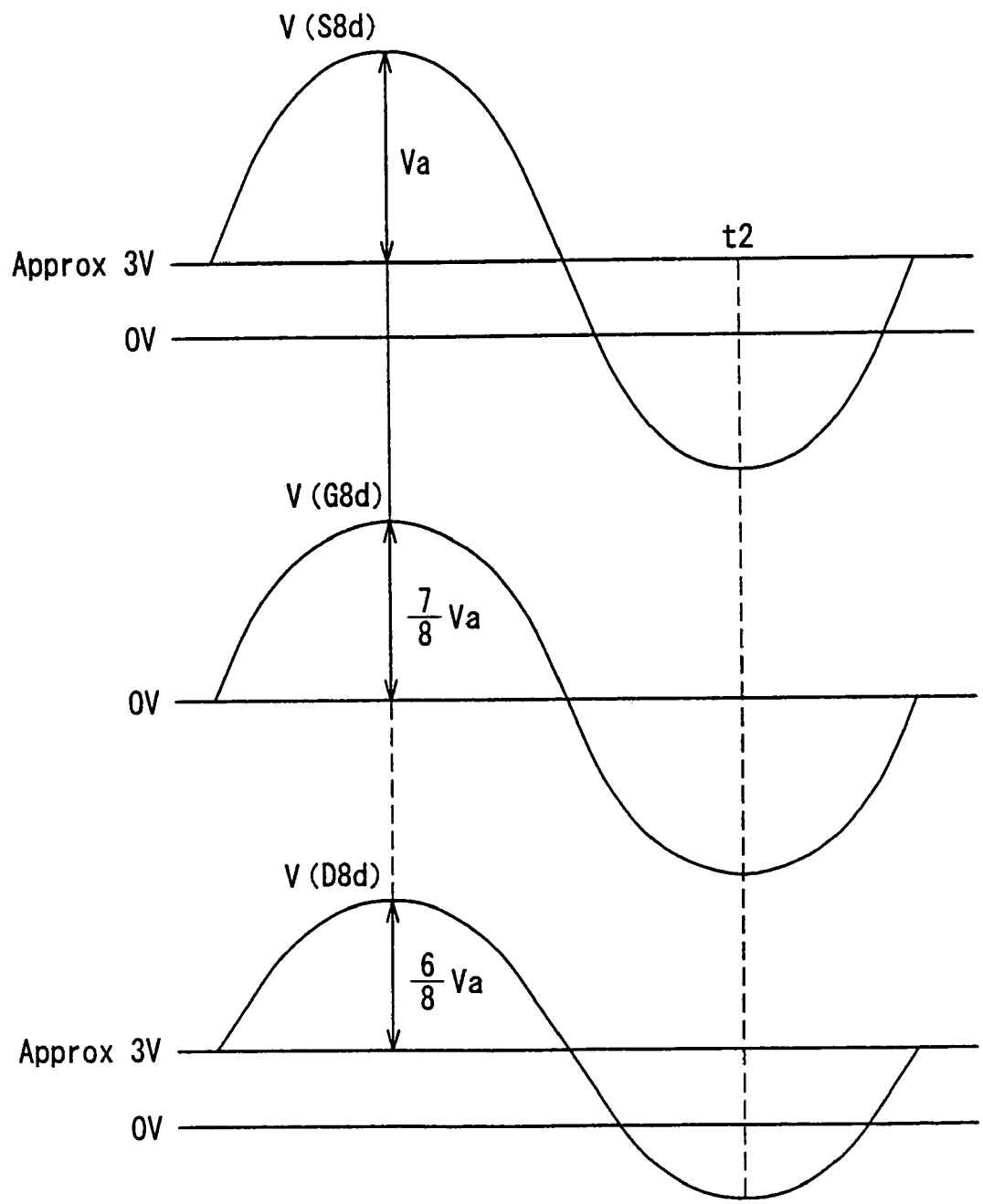
FIG. 13 is a waveform diagram showing the voltages of the gate, the source, and the drain of a field effect transistor.

FIG. 1 is a circuit diagram showing the configuration of a field effect transistor switch circuit according to Embodiment 1. In this figure, similarly to FIG. 5, field effect transistors 5a–5d, field effect transistors 6a–6d, field effect transistors 7a–7d, and field effect transistors 8a–8d constitute a DPDT (double pole double throw) switch. In each of the field effect transistors 5a–5d, 6a–6d, 7a–7d, 8a–8d, the main electrode nearer to the switch input terminal 1 or 3 is assigned to the source. In this field effect transistor switch circuit, each of resistors 17a–17d, 18a–18d, 19a–19d, 20a–20d is connected between the gate and the source of each of the field effect transistors 5a–5d, 6a–6d, 7a–7d, 8a–8d.

That is, a resistor 17a is connected between the gate G5a and the source S5a of the field effect transistor 5a. A resistor 18d is connected between the gate G6d and the source S6d of the field effect transistor 6d. A resistor 19a is connected between the gate G7a and the source S7a of the field effect transistor 7a. A resistor 20d is connected between the gate G8d and the source S8d of the field effect transistor 8d. Similarly, resistors 17b–17d, 18a–18c, 19b–19d, 20a–20c are connected respectively to the field effect transistors 5b–5d, 6a–6c, 7b–7d, 8a–8c. Further, resistors 9a–9d, 10a–10d, 11a–11d, 12a–12d are connected respectively between the gates of the field effect transistors 5a–5d, 6a–6d, 7a–7d, 8a–8d and the control terminal 21 or 22.

In the above-mentioned description, for simplicity, numerals 1 and 3 are assigned to switch input terminals, while numerals 2 and 4 are assigned to switch output terminals. However, this input/output assignment may be reverse. That is, each of the switch terminals 1–4 may be either a switch input terminal or a switch output terminal. It is sufficient that at least one is an input terminal and that at least one of the rest is an output terminal. For example, any one of the four switch terminals 1–4 may be a switch input terminal, while the other three switch terminals may be switch output terminals. In contrast, any one of the four switch terminals 1–4 maybe a switch output terminal, while the other three switch terminals may be switch input terminals.

Field effect transistors used in switching application have a symmetric configuration essentially, and hence the source and the drain are equivalent to each other. Thus, it is for convenience purpose that one of the main electrodes is referred to as the source and that the other is referred to as the drain. Accordingly, although one end of each of the resistors 17a–17d, 18a–18d, 19a–19d, 20a–20d is connected to the gate of each of the field effect transistors, the other end may be connected to either the source or the drain.

An exemplary operation according to Embodiment 1 of the invention is described below in detail with reference to FIG. 1. In the field effect transistor switch circuit having the above-mentioned configuration, when voltages of +Vc and 0 V are applied respectively as the control voltages Vc1 and Vc2 to the control terminals 21 and 22, relations between potentials at various points connected to the control terminal 21 or 22 become as described below.

When the potentials at the control terminals 21 and 22 are denoted by V(Vc1) and V(Vc2), respectively, the voltage condition is expressed as follows.

$+Vc = V(Vc1)$ $0V = V(Vc2)$

In this case, the following relation is obtained similarly to the prior art.

$+Vc = V(Vc1) > V(G8d) > V(S8d) = V(S5a) > V(G5a) > V(Vc2) = 0V$

In the prior art circuit, the potential $V(S5a) = V(S8d)$ has been $V(S5a) = V(S8d) \approx +Vc$ In this situation, when V(S5a) rises, this potential exceeds +Vc+Vth immediately. This causes the field effect transistors do not go ON.

In the field effect transistor switch circuit having the above-mentioned configuration, attention is temporarily focused solely on the control terminals 21, 22 and the resistors 9a, 12d, 17a, 20d. When the resistors 9a and 12d have the same characteristics with each other, and when the resistors 17a, 20d have the same characteristics with each other, the following relation is obtained.

$V(S5a) = V(S8d) = (+Vc/2)V$

However, because of the self-bias effect of the field effect transistor 5a, the DC potential V(S5a) of the switch input terminal 1 becomes as follows.

$(+Vc/2) < V(S5a) < +Vc$

Thus, when the resistor 17a is connected, the DC potential of the switch input terminal 1 is fixed always below +Vc. By virtue of this, even when a signal having a large amplitude is inputted, the DC potential of the switch input terminal 1 does not rise. Accordingly, the ON/OFF state is normally switched using the control voltages 0 V and +Vc.

In this embodiment, each of the resistors 17a–17d, 18a–18d, 19a–19d, 20a–20d is connected between the gate and the source of each of the field effect transistors 5a–5d, 6a–6d, 7a–7d, 8a–8d. Accordingly, the potentials of the switch input terminals 1 and 3 are fixed by the resistors 17a–17d, 18a–18d, 19a–19d, 20a–20d. By virtue of this, the DC potentials of the switch input terminals 1 and 3 do not rise, whereby ON/OFF switching is performed normally, even when a signal having a large amplitude is inputted to the switch input terminals 1 and 3, thereby the depletion layers of the switch input terminals 1 and 3 expand due to electron trapping effect.

The chip size is reduced in comparison with prior art field effect transistor switch circuits for large amplitudes. The reason is as follows. In prior art field effect transistor switch circuits for large amplitudes, the number of field effect transistor stages has been increased, or alternatively, a capacitance occupying a large area has been connected between the gate and the switch input terminal. In contrast, in the invention, resistors having a small area are connected in order to process large amplitudes.

Thus, without increasing the number of serial field effect transistor stages (that is, using the same number of stages), ON/OFF switching is performed normally even for input signals having larger amplitudes. Resistors occupy a smaller area on the circuit chip than field effect transistors and capacitances. Thus, the overall size is reduced.

Described below is the reason why large amplitudes can be processed when the number of field effect transistor stages has been increased, or alternatively when a capacitance occupying a large area has been connected between the gate and the switch input terminal.

The serial circuit of a plurality of the field effect transistors in the OFF state is equivalent to a serial connection circuit of the gate-source capacitances and the gate-drain capacitances. This circuit is composed of 2n capacitances connected in series, when the serial connection stage number of field effect transistors is n (n is an arbitrary integer). The amplitude of the input signal is divided by the 2n capacitances. Depending on the relation between the divided voltage and the threshold voltage Vth of the field effect transistor, the field effect transistor does not go OFF but remains ON in case that the stage number is small.

Accordingly, in case of a large amplitude, the stage number needs to be increased. In general, in case of 30 dBm or the like, field effect transistors are arranged in four stages or the like. Nevertheless, in GSM scheme or the like, 35 dBm or the like needs to be processed. Also in this case, when a resistor is connected between the gate and the source or drain of the field effect transistor according to the invention, the number of field effect transistor stages needs not to be increased.

The addition of the capacitance compensates the insufficiency of capacitance caused by the expansion of the depletion layer. This restores normal voltage division ratios.

[Embodiment 2]

Figure 2:
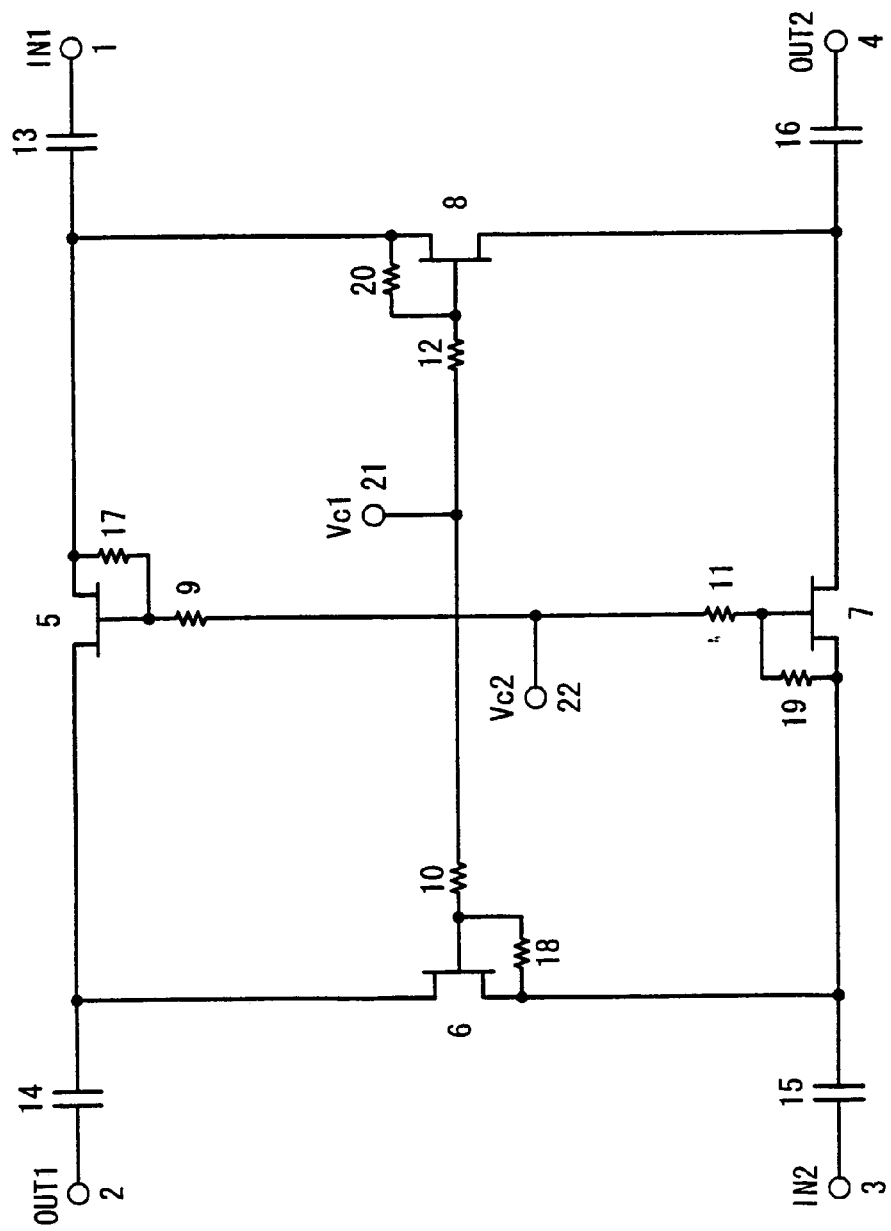
FIG. 2 is an equivalent circuit diagram showing the configuration of a field effect transistor switch circuit according to Embodiment 2 of the invention.

FIG. 2 is a circuit diagram showing the configuration of a field effect transistor switch circuit according to Embodiment 2. The difference from Embodiment 1 is that each of the field effect transistors 5–8 constituting the DPDT switch is composed of a single field effect transistor. That is, in this figure, a field effect transistor 5, a field effect transistor 6, a field effect transistor 7, and a field effect transistor 8 constitutes a DPDT switch. In this field effect transistor switch circuit, each of resistors 17, 18, 19, 20 is connected between the gate and the source (switch input terminal) of each of the field effect transistors 5, 6, 7, 8. Further, each of resistors 9–12 is connected between the gate of each of the field effect transistors 5–8 and the control terminal 21 or 22.

Similarly to Embodiment 1, also in this embodiment, when comparison is made between the cases of the same serial transistor stage number, by virtue of the use of the resistors 17, 18, 19, 20, even when a signal having a large amplitude is inputted, the DC potentials of the switch input terminals do not rise, whereby ON/OFF switching is performed normally. Further, the chip size is reduced in comparison with prior art field effect transistor switch circuits for large amplitudes.

Described below is the relation between the serial stage number of field effect transistors and the addition of resistors. Basically, the serial stage number of field effect transistors determines the maximum input signal. However, when comparison is made between the cases of the same stage number, larger input can be processed in the case that registers are added between the gates and the sources of the field effect transistors. The serial stage number of field effect transistors has a dominant influence to the input signal. However, when comparison is made between the cases of the same stage number, the addition of resistors permit the processing of larger input.

The above-mentioned embodiment has been described for the case of a field effect transistor switch circuit comprising two switch input terminals, two switch output terminals, and four field effect transistors. However, the invention is applicable also to the following configuration. That is, the invention is applicable also to a field effect transistor switch circuit composed of the upper half of the above-mentioned circuit, that is, to a field effect transistor switch circuit comprising two switch input terminals, a switch output terminal, and two field effect transistors. The invention is applicable also to a field effect transistor switch circuit comprising a switch input terminal, two switch output terminals, and two field effect transistors. Further, the invention is applicable to the case of a single input and multiple outputs (greater than three) and the case of multiple inputs (greater than three) and a single output.

[Embodiment 3]

Figure 3:
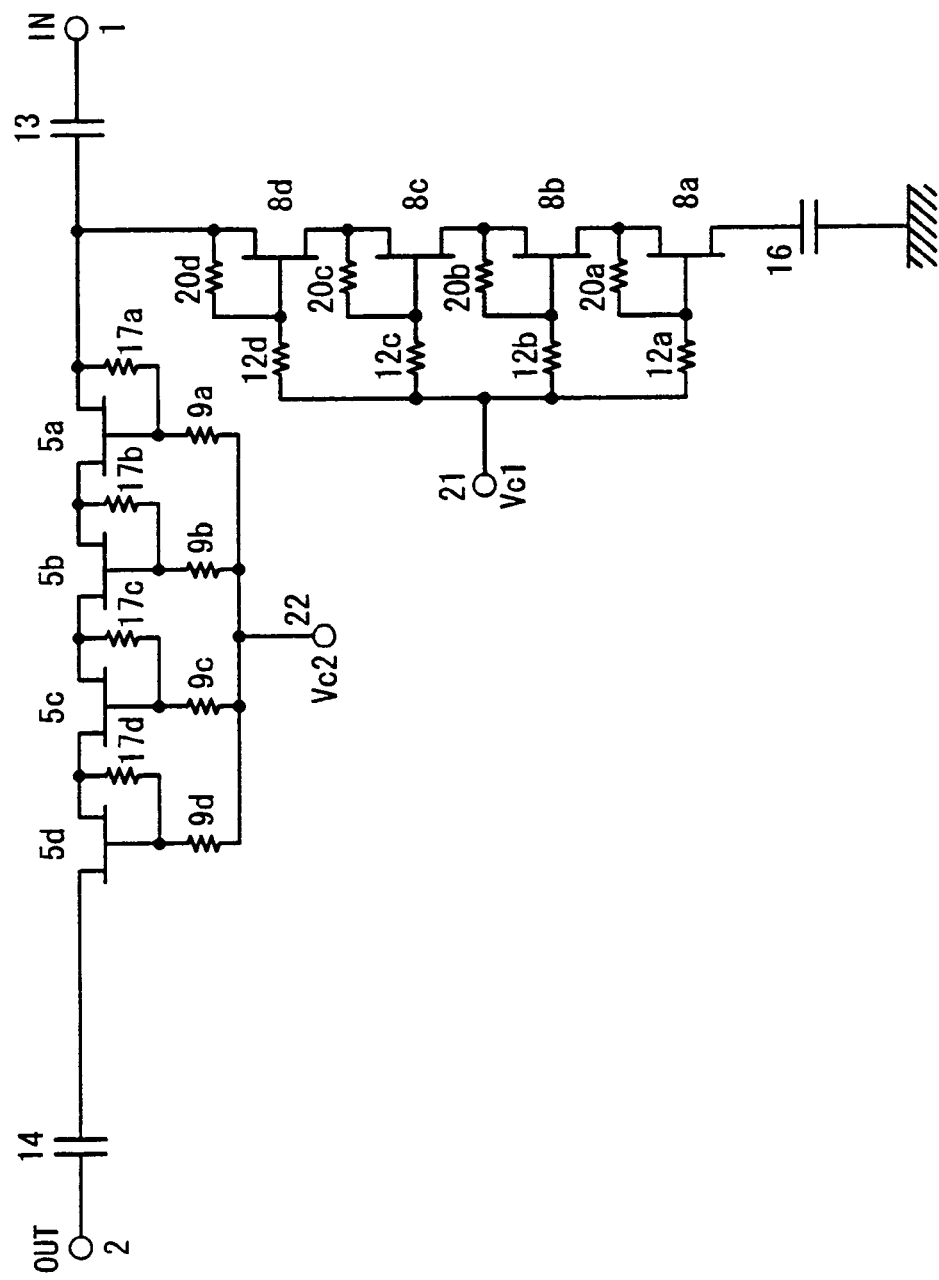
FIG. 3 is an equivalent circuit diagram showing the configuration of a field effect transistor switch circuit according to Embodiment 3 of the invention.

FIG. 3 is a circuit diagram showing the configuration of a field effect transistor switch circuit according to Embodiment 3. The difference from Embodiment 1 is that the circuit is in SPST (single pole single throw) configuration comprising a switch input terminal 1 and a switch output terminal 2.

That is, in this figure, a serial circuit of field effect transistors 5a–5d connected between a switch input terminal 1 and a switch output terminal 2 constitutes a SPST switch. Further, a serial circuit of field effect transistors 8a–8d is connected between a switch input terminal 1 and the ground, whereby when the electric conduction between the switch input terminal 1 and the switch output terminal 2 is open, these field effect transistors 8a–8d go ON. This improves isolation characteristics.

In each of the field effect transistors 5a–5d and 8a–8d, when the main electrode nearer to the switch input terminal 1 is assigned to the source, each of resistors 17a–17d and 20a–20d is connected between the gate and the source.

In this embodiment, each of the resistors 17a–17d and 20a–20d is connected between the gate and the source of each of the field effect transistors 5a–5d and 8a–8d. Accordingly, the potential of the switch input terminal 1 is fixed by the resistors 17a–17d and 20a–20d. By virtue of this, the DC potential of the switch input terminal 1 does not rise, whereby ON/OFF switching is performed normally, even when a signal having a large amplitude is inputted to the switch input terminal 1, thereby the depletion layer expands due to electron trapping effect. Further, the chip size is reduced in comparison with prior art field effect transistor switch circuits for large amplitudes.

In the above-mentioned description, the switch terminal 1 has been assigned to a switch input terminal, while the switch terminal 2 has been assigned to a switch output terminal. However, this input/output assignment may be reverse. Further, the relation between the source and the drain of the field effect transistor is similar to that of Embodiment 1.

[Embodiment 4]

Figure 4:
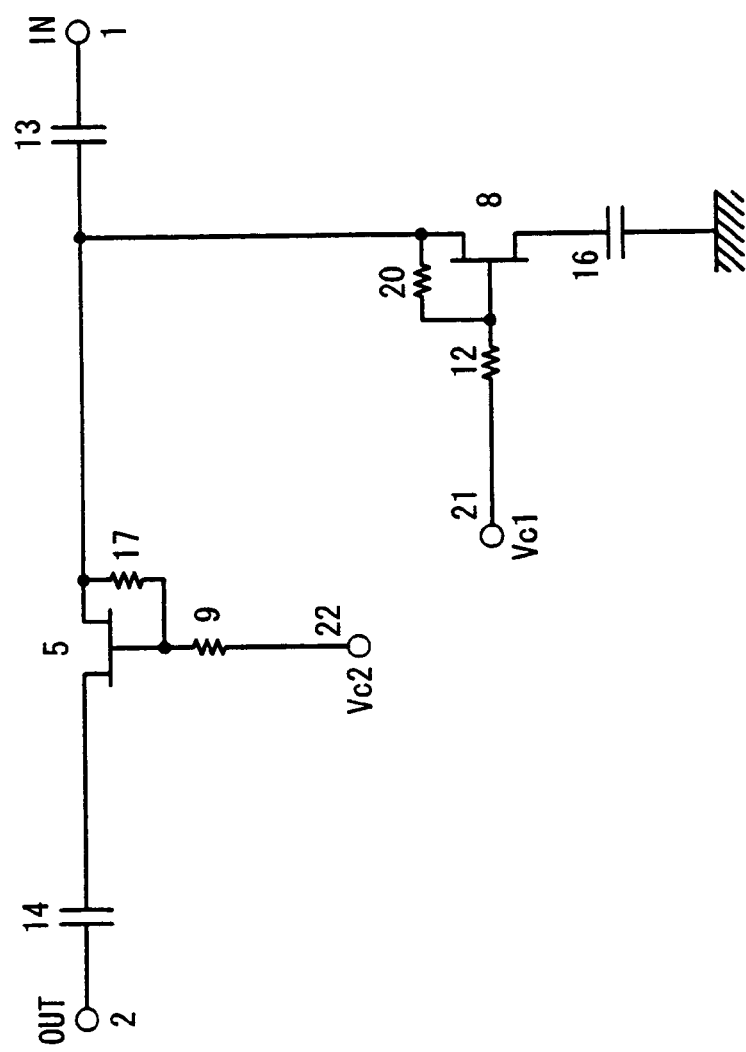
FIG. 4 is an equivalent circuit diagram showing the configuration of a field effect transistor switch circuit according to Embodiment 4 of the invention.

FIG. 4 is a circuit diagram showing the configuration of a field effect transistor switch circuit according to Embodiment 4. The difference from Embodiment 3 is that each of the field effect transistor 5 between a switch input terminal 1 and a switch output terminal 2 and the field effect transistor 8 between the switch input terminal 1 and the ground is composed of a single field effect transistor. That is, in this figure, the field effect transistor 5 is connected between the switch input terminal 1 and the switch output terminal 2, while the field effect transistor 8 is connected between the switch input terminal 1 and the ground.

In each of the field effect transistors 5 and 8, each of resistors 17 and 20 is connected between the gate and the source (switch input terminal 1). In this case, similarly to Embodiment 2, even when a signal having a large amplitude is inputted, the DC potential of the switch input terminal 1 does not rise, whereby ON/OFF switching is performed normally. Further, the chip size is reduced in comparison with prior art field effect transistor switch circuits for large amplitudes.

The above-mentioned embodiment has been described for the case that a resistor is connected between the gate and the source of each field effect transistor. However, a correction capacitance for correcting unbalance of equivalent capacitances between the gate and the source of the field effect transistor during the OFF state of the field effect transistor may be provided between the gate and the source of the field effect transistor, in parallel to the resistor, as shown in FIGS. 14–17. Further, a correction capacitance may be provided in place of the resistor, as shown in FIGS. 18–21. In this case, the correction capacitance needs to be smaller than the depletion layer capacitance during the ON-state of the field effect transistor, and larger than the depletion layer capacitance during the OFF-state.

Figure 14:
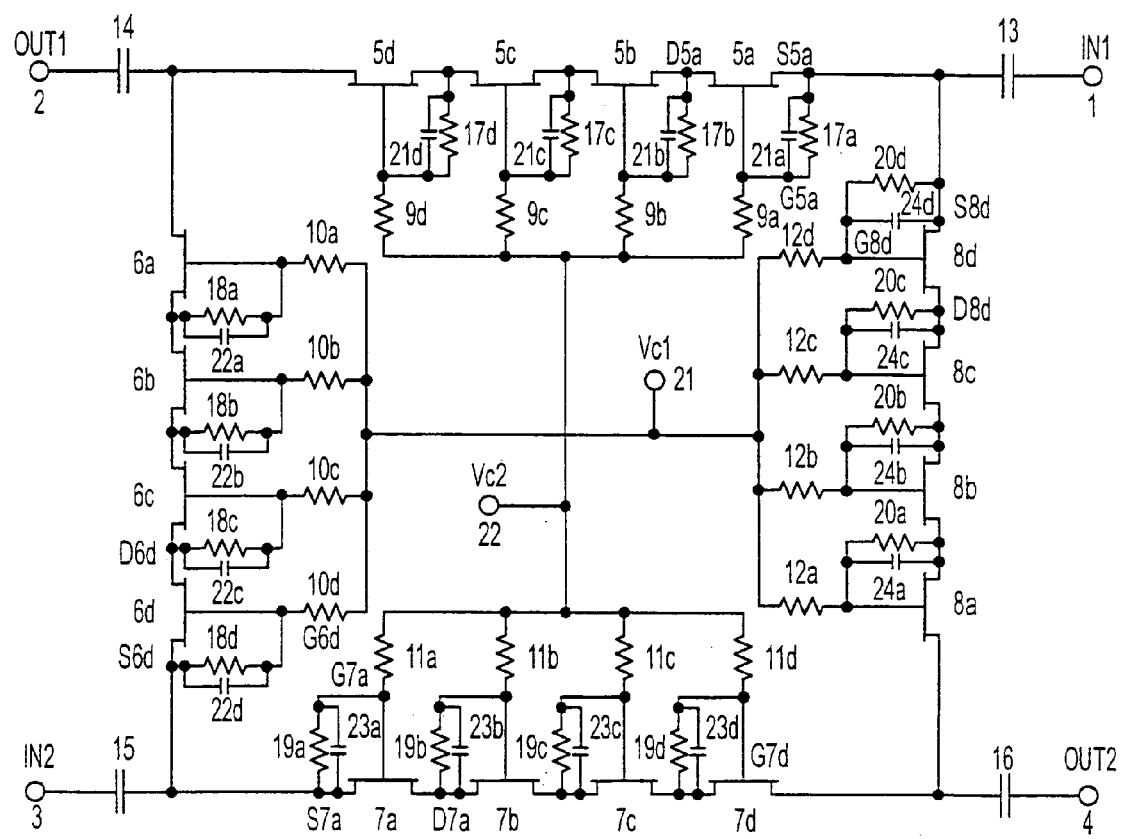
FIGS. 14–17 illustrate the circuits of FIGS. 1–4 with correction capacitances connected in parallel with resistors for correcting the imbalance of equivalent capacitances between the gate and the source of each field effect transistor during an OFF state.
Figure 15:
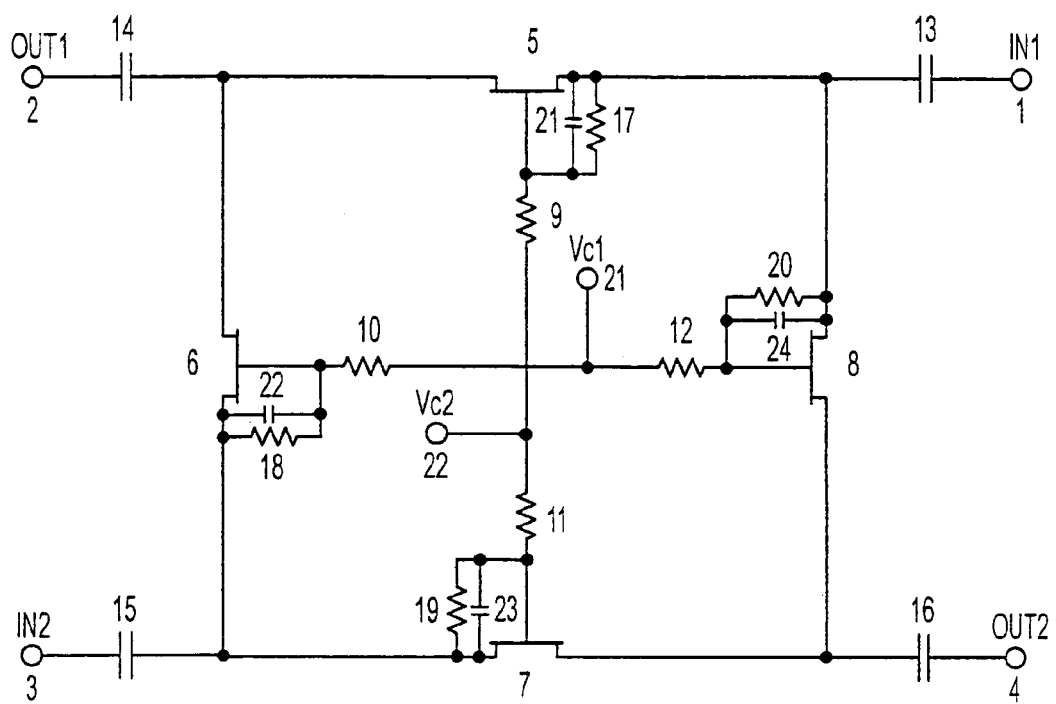
Figure 16:
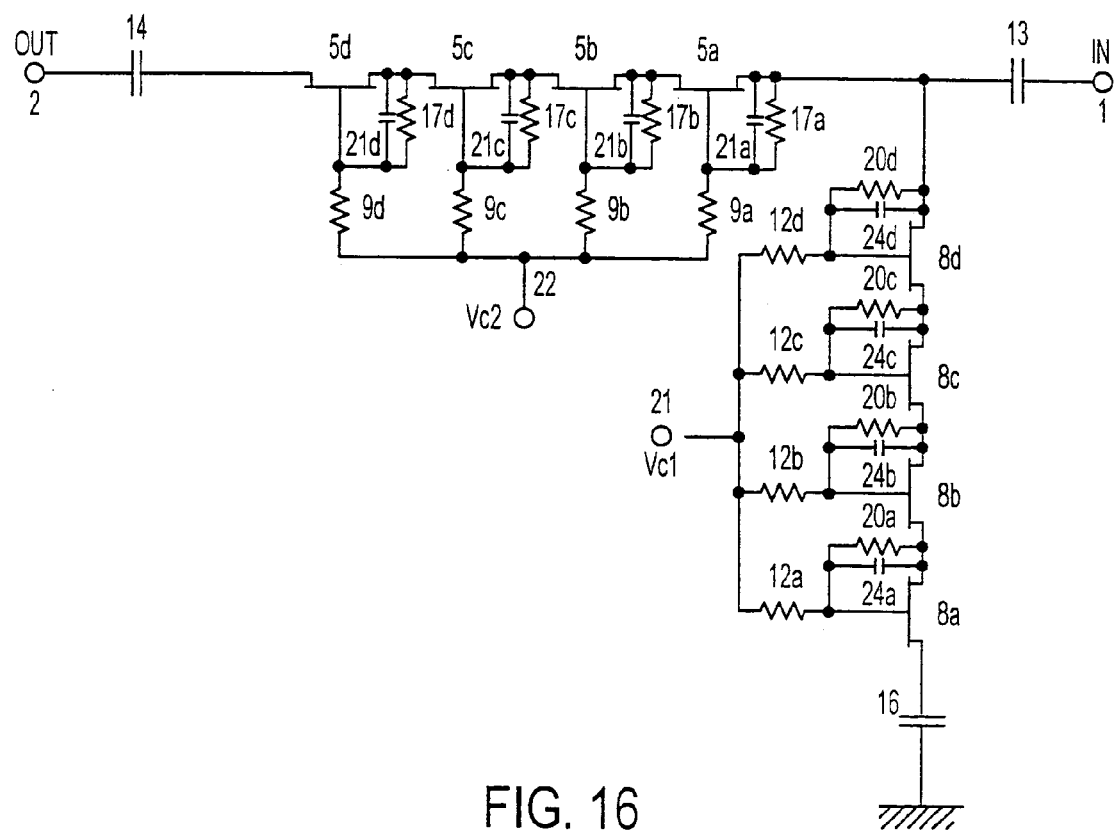
Figure 17:
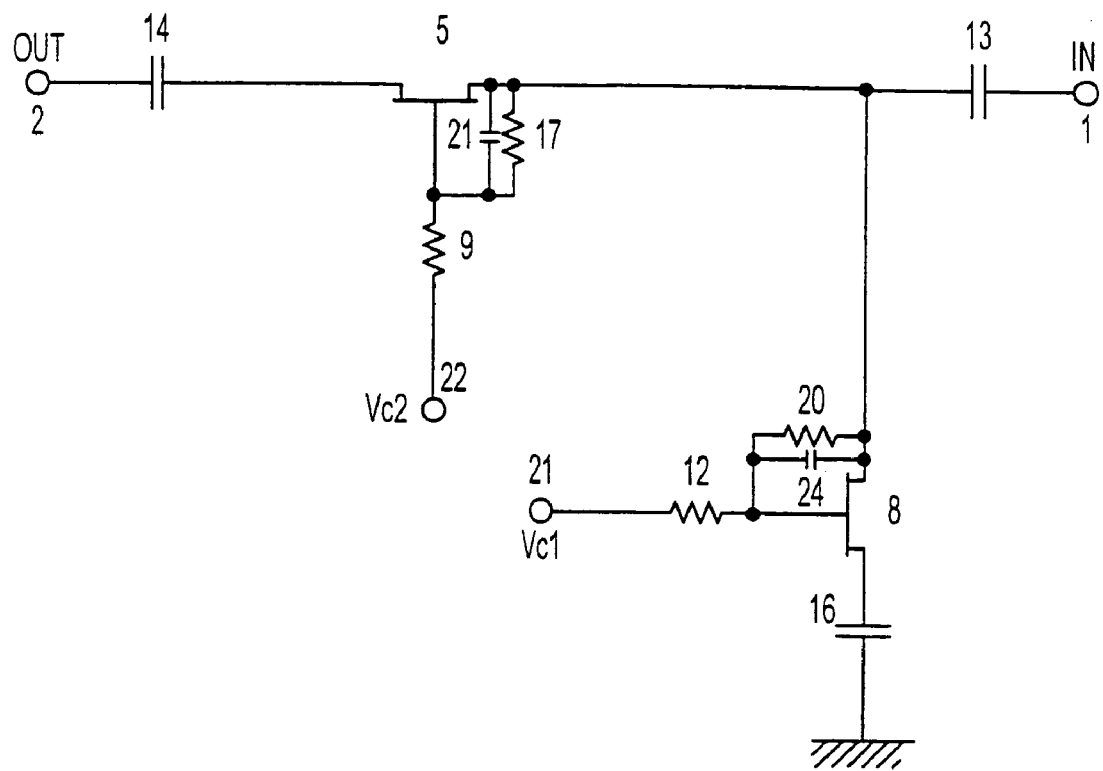

In particular, in FIG. 14, like elements to those of FIG. 1 are labeled with the same reference characters and the parallel capacitances are labeled 21a–21d for field effect transistors 5a–5d, 22a–22d for field effect transistors 6a–6d, 23a–23d for field effect transistors 7a–7d, and 24a–24d for field effect transistors 8a–8d. In FIG. 15, like elements to those of FIG. 2 are labeled with the same reference characters and the parallel capacitances are labeled 21 for field effect transistor 5, 22 for field effect transistor 6, 23 for field effect transistor 7, and 24 for field effect transistor 8. In FIG. 16, like elements to those of FIG. 3 are labeled with the same reference characters and the parallel capacitances are labeled 21a–21d for field effect transistors 5a–5d and 24a–24d for field effect transistors 8a–8d. In FIG. 17, like elements to those of FIG. 4 are labeled with the same reference characters and the parallel capacitances are labeled 21 for field effect transistor 5 and 24 for field effect transistor 8.

Figure 18:
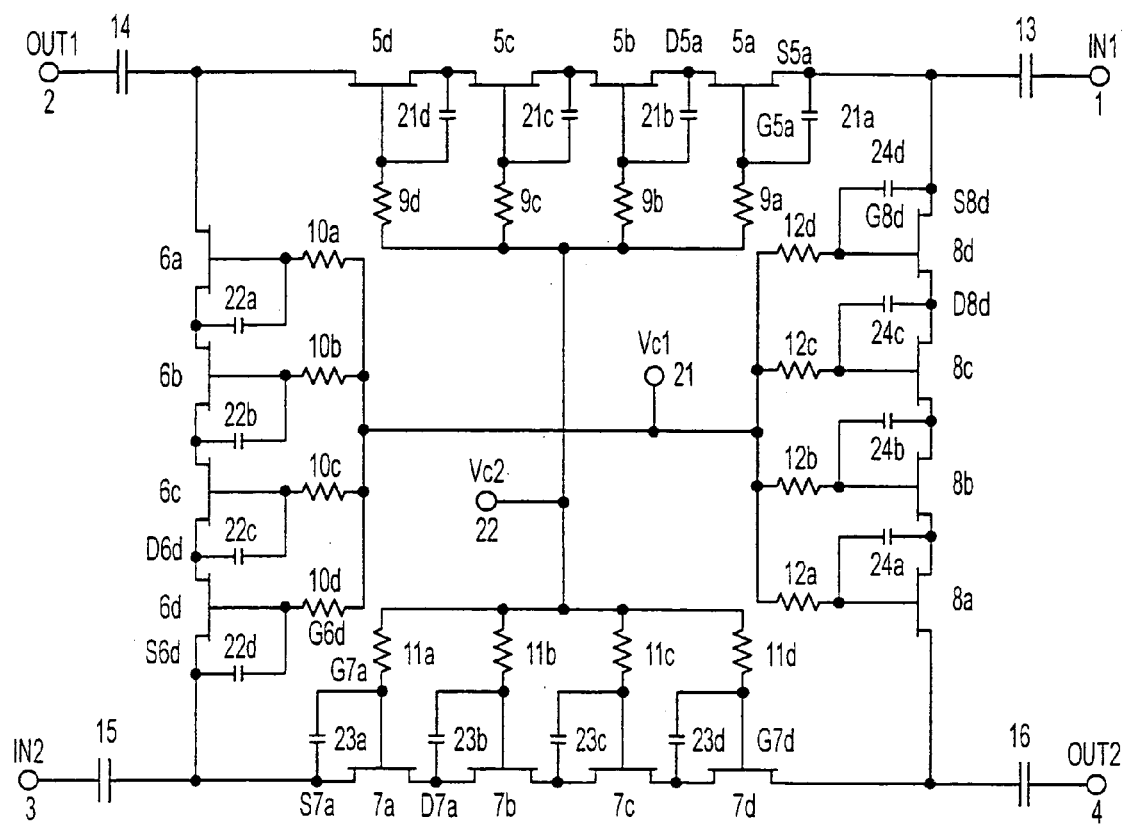
FIGS. 18–21 illustrate the circuits of FIGS. 14–17 with the parallel resistors omitted.
Figure 19:
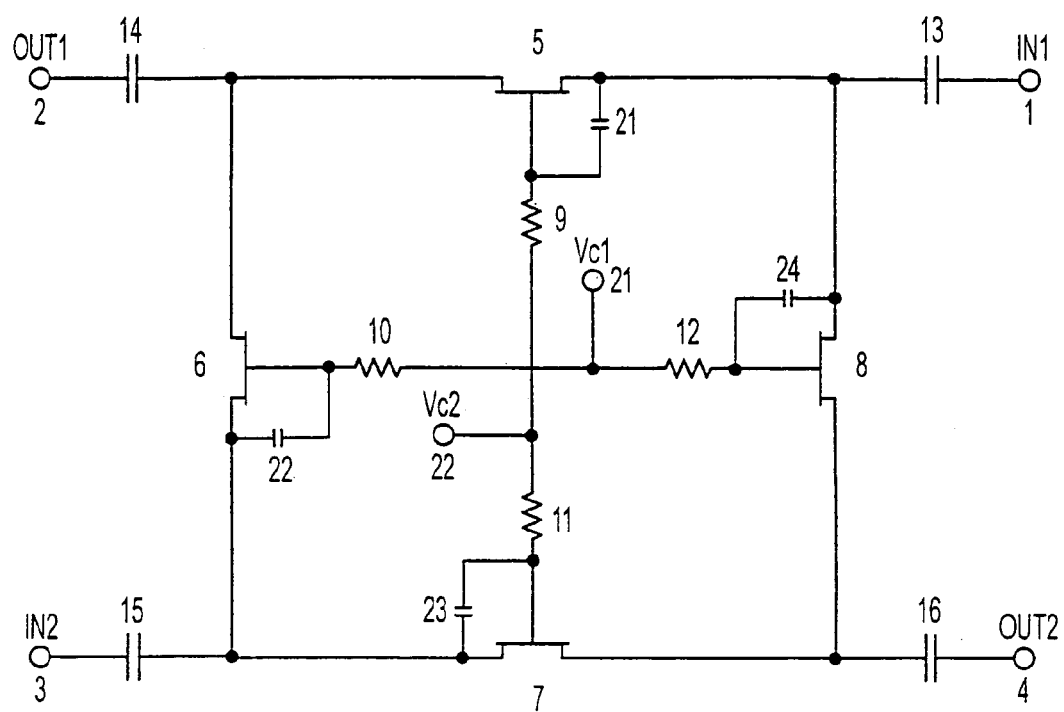
Figure 20:
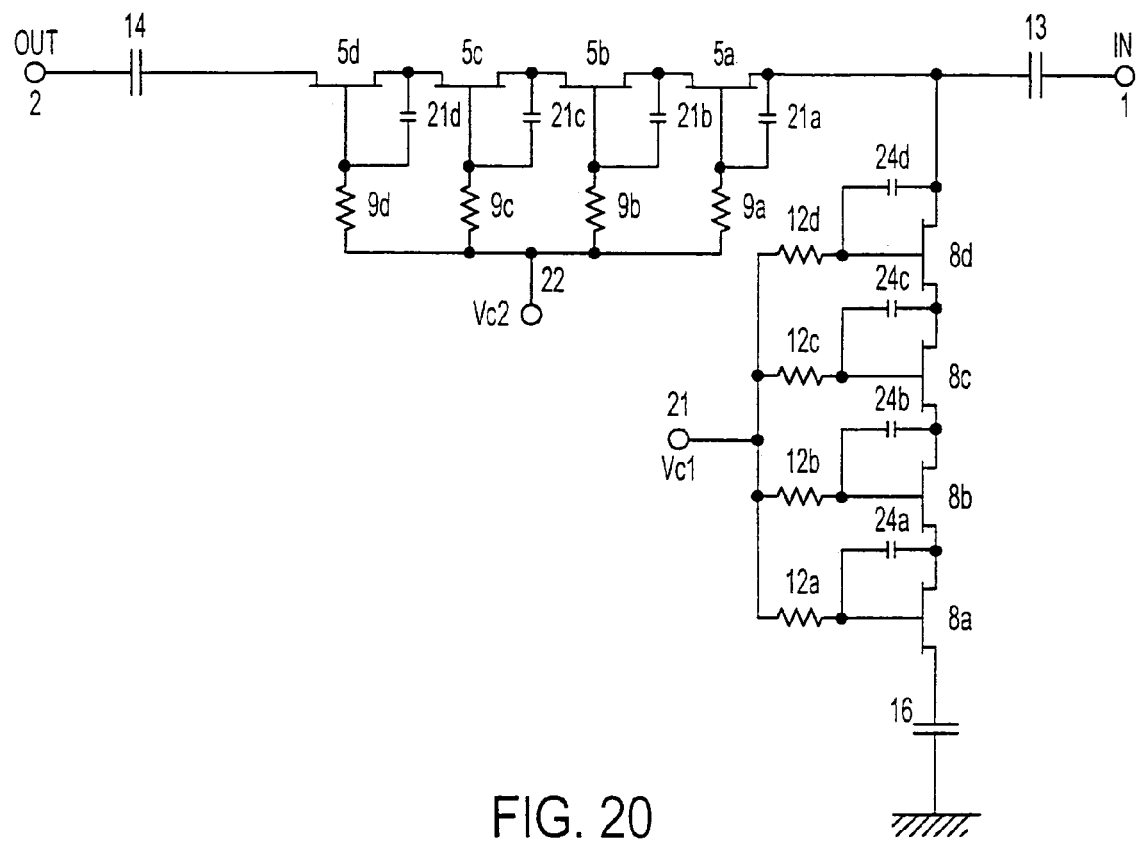
Figure 21:
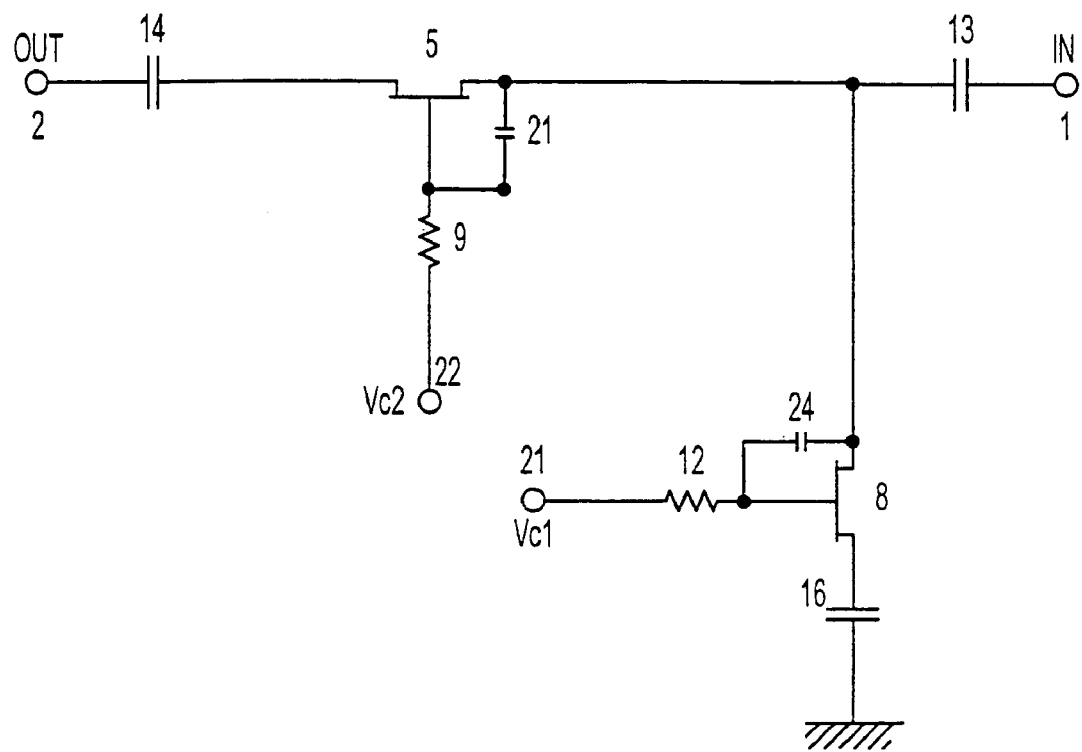

Further, in FIG. 18, like elements to those of FIG. 1 are labeled with the same reference characters and the correction capacitances are labeled 21a–21d for field effect transistors 5a–5d, 22a–22d for field effect transistors 6a–Ed, 23a–23d for field effect transistors 7a–7d, and 24a–24d for field effect transistors 8a–8d. In FIG. 19, like elements to those of FIG. 2 are labeled with the same reference characters and the correction capacitances are labeled 21 for field effect transistor 5, 22 for field effect transistor 6, 23 for field effect transistor 7, and 24 for field effect transistor 8. In FIG. 20, like elements to those of FIG. 3 are labeled with the same reference characters and the correction capacitances are labeled 21a–21d for field effect transistors 5a–5d and 24a–24d for field effect transistors 8a–8d. In FIG. 21, like elements to those of FIG. 4 are labeled with the same reference characters and the correction capacitances are labeled 21 for field effect transistor 5 and 24 for field effect transistor 8.

Described below is the effect of the addition of correction capacitances. The addition of resistors needs merely a small area, however, when the depletion layer expands due to electron trapping effect, the capacitance decreases. In order to compensate this decrease, a correction capacitance may be provided between the gate and the source of the field effect transistor. This permits the processing of large amplitudes. This is because the correction capacitance resolves the unbalance of capacitances and thereby restores normal voltage division ratios.

Nevertheless, small and insufficient correction capacitances have no effect, while excessively large correction capacitances reduces the impedance of that portion and thereby results in signal leakage to the OFF side. Such situations places the above-mentioned requirement that the correction capacitance is smaller than the depletion layer capacitance during the ON-state of the field effect transistor, and larger than the depletion layer capacitance during the OFF-state.

For example, when the gate-source capacitance of the field effect transistor decreases from C into (½)C, a correction capacitance of (½)C may be connected. This restores normal voltage division ratios. Accordingly, even when a signal having a large amplitude is inputted, the DC potential of the switch input terminal does not rise, whereby ON/OFF switching is performed normally.

What is claimed is:

1. A field effect transistor switch circuit comprising:
   a first field effect transistor stage that is connected in series between a first switch terminal and a second switch terminal;
   a second field effect transistor stage that is connected in series between the first switch terminal and a third switch terminal;
   a first control line for supplying a first control voltage to a control electrode of said first field effect transistor stage; and
   a second control line for supplying the complimentary voltage of said first control voltage to a control electrode of said second field effect transistor stage, wherein:
   each of said first and second field effect transistor stages comprises a series circuit having a plurality of field effect transistors,
   each of said field effect transistors has a first resistor connected between the field effect transistor's gate and source electrodes, and
   the gate electrode of each field effect transistor is connected to the corresponding control electrode via a second resistor.

2. The field effect transistor switch circuit of claim 1, wherein the third switch terminal is a ground terminal.

3. The field effect transistor switch circuit of claim 1, further comprising:
   a third field effect transistor stage that is connected in series between the third switch terminal and a fourth switch terminal; and
   a fourth field effect transistor stage that is connected in series between the fourth switch terminal and the second switch terminal, wherein:
   each of the third and fourth field effect transistor stages comprises a series circuit having a plurality of field effect transistors,
   each of the field effect transistors of the third and fourth field effect transistor stages has a first resistor connected between the field effect transistor's gate and source electrodes, and
   the gate electrode of each of the field effect transistors of the third and fourth field effect transistor stages is connected to a control electrode, corresponding to the respective field effect transistor stage, via a second resistor.

4. A field effect transistor switch circuit comprising:
a first field effect transistor stage that is connected in series between a first switch terminal and a second switch terminal; and
a second field effect transistor stage that is connected in series between the first switch terminal and a third switch terminal, wherein:
each of said first and second field effect transistor stages comprises a series circuit having a plurality of field effect transistors,
each of the field effect transistors has a resistor and a correction capacitance, which are connected in parallel, connected between the field effect transistor's gate and source electrodes, and
each of said correction capacitances corrects an imbalance of an equivalent capacitance between the respective field effect transistor's gate and source electrodes during the OFF state of the field effect transistor.

5. The field effect transistor switch circuit of claim 4, wherein the third switch terminal is a ground terminal.

6. The field effect transistor switch circuit of claim 4, further comprising:
a third field effect transistor stage that is connected in series between the third switch terminal and a fourth switch terminal; and
a fourth field effect transistor stage that is connected in series between the fourth switch terminal and the second switch terminal, wherein:
each of the third and fourth field effect transistor stages comprises a series circuit having a plurality of field effect transistors,
each of the field effect transistors of the third and fourth field effect transistor stages has a resistor and a correction capacitance, which are connected in parallel, connected between the field effect transistor's gate and source electrodes, and
each of said correction capacitances of the third and fourth field effect transistor stages corrects an imbalance of an equivalent capacitance between the respective field effect transistor's gate and source electrodes during the OFF state of the field effect transistor.

7. A field effect transistor switch circuit comprising:
a first field effect transistor stage that is connected in series between a first switch terminal and a second switch terminal;
a second field effect transistor stage that is connected in series between the first switch terminal and a third switch terminal;
a first control line for supplying a first control voltage to a control electrode of said first field effect transistor stage; and
a second control line for supplying the complimentary voltage of said first control voltage to a control electrode of said second field effect transistor stage, wherein:
each of said first and second field effect transistor stages comprises a series circuit having a plurality of field effect transistors,
each of the field effect transistors has a first resistor and a correction capacitance, which are connected in parallel, connected between the field effect transistor's gate and source electrodes,
each of said correction capacitances corrects an imbalance of an equivalent capacitance between the respective field effect transistor's gate and source electrodes during the OFF state of the field effect transistor, and
the gate electrode of each field effect transistor is connected to the corresponding control electrode via a second resistor.

8. The field effect transistor switch circuit of claim 7, wherein the third switch terminal is a ground terminal.

9. The field effect transistor switch circuit of claim 7, further comprising:
a third field effect transistor stage that is connected in series between the third switch terminal and a fourth switch terminal; and
a fourth field effect transistor stage that is connected in series between the fourth switch terminal and the second switch terminal, wherein:
each of the third and fourth field effect transistor stages comprises a series circuit having a plurality of field effect transistors,
each of the field effect transistors of the third and fourth field effect transistor stages has a first resistor and a correction capacitance, which are connected in parallel, connected between the field effect transistor's gate and source electrodes,
each of said correction capacitances of the third and fourth field effect transistor stages corrects an unbalance of an equivalent capacitance between the respective field effect transistor's gate and source electrodes during the OFF state of the field effect transistor, and
the gate electrode of each field effect transistor of the third and fourth field effect transistor stages is connected to a corresponding control electrode via a second resistor.

10. A field effect transistor switch circuit comprising:
a first field effect transistor stage that is connected in series between a first switch terminal and a second switch terminal;
a second field effect transistor stage that is connected in series between the first switch terminal and a third switch terminal;
a first control line for supplying a first control voltage to a control electrode of said first field effect transistor stage; and
a second control line for supplying the complimentary voltage of said first control voltage to a control electrode of said second field effect transistor stage, wherein:
each of said first and second field effect transistor stages comprises a series circuit having a plurality of field effect transistors,
each of the field effect transistors has a correction capacitance connected between the field effect transistor's gate and source electrodes,
each of said correction capacitances corrects an imbalance of an equivalent capacitance between the respective field effect transistor's gate and source electrodes during the OFF state of the field effect transistor, and
the gate electrode of each field effect transistor is connected to the corresponding control electrode via a resistor.

11. The field effect transistor switch circuit of claim 10, wherein the third switch terminal is a ground terminal.

12. The field effect transistor switch circuit of claim 10, further comprising:
a third field effect transistor stage that is connected in series between the third switch terminal and a fourth switch terminal; and a fourth field effect transistor stage that is connected in series between the fourth switch terminal and the second switch terminal, wherein:

each of the third and fourth field effect transistor stages comprises a series circuit having a plurality of field effect transistors, each of the field effect transistors of the third and fourth field effect transistor stages has a correction capacitance connected between the field effect transistor's gate and source electrodes, and each of said correction capacitances of the third and fourth field effect transistor stages corrects an imbalance of an equivalent capacitance between the respective field effect transistor's gate and source electrodes during the OFF state of the field effect transistor.

13. A field effect transistor switch circuit comprising:

a first field effect transistor stage that is connected in series between a first switch terminal and a second switch terminal;

a second field effect transistor stage that is connected in series between the first switch terminal and a third switch terminal, wherein:

each of the first and second field effect transistor stages has a resistor and a correction capacitance, which are connected in parallel, connected between a control electrode and a main electrode, which is connected to one of the first, second, and third switch terminals, each of said correction capacitances corrects an imbalance of an equivalent capacitance between the respective field effect transistor stage's control and main electrodes during the OFF state of the field effect transistor stage, and the capacitance of each of the correction capacitances is smaller than the depletion layer capacitance, during the ON-state, of the corresponding field effect transistor stage, and larger than the depletion layer capacitance during the OFF-state.

14. A field effect transistor switch circuit comprising:

a first field effect transistor stage that is connected in series between a first switch terminal and a second switch terminal;

a second field effect transistor stage that is connected in series between the first switch terminal and a third switch terminal, wherein:

each of said first and second field effect transistor stages comprises a series circuit having a plurality of field effect transistors, each of the field effect transistors has a resistor and a correction capacitance, which are connected in parallel, connected between the field effect transistor's gate and source/drain electrodes, each of said correction capacitances corrects an imbalance of an equivalent capacitance between the respective field effect transistor's gate and source/drain electrodes during the OFF state of the field effect transistor, and the capacitance of each of the correction capacitances is smaller than the depletion layer capacitance, during the ON-state, of the corresponding field effect transistor, and larger than the depletion layer capacitance during the OFF-state.

15. A field effect transistor switch circuit comprising:

a first field effect transistor stage that is connected in series between a first switch terminal and a second switch terminal;

a second field effect transistor stage that is connected in series between the first switch terminal and a third switch terminal, wherein:

each of the first and second field effect transistor stages has a resistor and a correction capacitance, which are connected in parallel, connected between a control electrode and a main electrode, which is connected to one of the first, second, and third switch terminals, each of said correction capacitances corrects an imbalance of an equivalent capacitance between the respective field effect transistor stage's control and main electrodes during the OFF state of the field effect transistor stage, the capacitance of each of the correction capacitances is smaller than the depletion layer capacitance, during the ON-state, of the corresponding field effect transistor stage, and larger than the depletion layer capacitance during the OFF-state, and the third switch terminal is a ground terminal.

16. A field effect transistor switch circuit comprising:

a first field effect transistor stage that is connected in series between a first switch terminal and a second switch terminal;

a second field effect transistor stage that is connected in series between the first switch terminal and a third switch terminal, wherein:

each of said first and second field effect transistor stages comprises a series circuit having a plurality of field effect transistors, each of the field effect transistors has a resistor and a correction capacitance, which are connected in parallel, connected between the field effect transistor's gate and source/drain electrodes, each of said correction capacitances corrects an imbalance of an equivalent capacitance between the respective field effect transistor's gate and source/drain electrodes during the OFF state of the field effect transistor, the capacitance of each of the correction capacitances is smaller than the depletion layer capacitance, during the ON-state, of the corresponding field effect transistor, and larger than the depletion layer capacitance during the OFF-state, and the third switch terminal is a ground terminal.

17. A field effect transistor switch circuit comprising:

a first field effect transistor stage that is connected in series between a first switch terminal and a second switch terminal;

a second field effect transistor stage that is connected in series between the first switch terminal and a third switch terminal;

a third field effect transistor stage that is connected in series between the third switch terminal and a fourth switch terminal;

a fourth field effect transistor stage that is connected in series between the fourth switch terminal and the second switch terminal, wherein:

each of the first, second, third, and fourth field effect transistor stages has a resistor and a correction capacitance, which are connected in parallel, connected between a control electrode and a main electrode, which is connected to one of the first, second, third, and fourth switch terminals, each of said correction capacitances corrects an imbalance of an equivalent capacitance between the respective field effect transistor stage's control and main electrodes during the OFF state of the field effect transistor stage, and the capacitance of each of the correction capacitances is smaller than the depletion layer capacitance, during the ON-state, of the corresponding field effect transistor stage, and larger than the depletion layer capacitance during the OFF-state.

18. A field effect transistor switch circuit comprising:

a first field effect transistor stage that is connected in series between a first switch terminal and a second switch terminal;

a second field effect transistor stage that is connected in series between the first switch terminal and a third switch terminal;

a third field effect transistor stage that is connected in series between the third switch terminal and a fourth switch terminal; and a fourth field effect transistor stage that is connected in series between the fourth switch terminal and the second switch terminal, wherein:

each of said first, second, third, and fourth field effect transistor stages comprises a series circuit having a plurality of field effect transistors, each of the field effect transistors has a resistor and a correction capacitance, which are connected in parallel, connected between the field effect transistor's gate and source/drain electrodes, each of said correction capacitances corrects an imbalance of an equivalent capacitance between the respective field effect transistor's gate and source/drain electrodes during the OFF state of the field effect transistor, and the capacitance of each of the correction capacitances is smaller than the depletion layer capacitance, during the ON-state, of the corresponding field effect transistor, and larger than the depletion layer capacitance during the OFF-state.

19. A field effect transistor switch circuit comprising:

a first field effect transistor stage that is connected in series between a first switch terminal and a second switch terminal;

a second field effect transistor stage that is connected in series between the first switch terminal and a third switch terminal;

a third field effect transistor stage that is connected in series between the third switch terminal and a fourth switch terminal;

a fourth field effect transistor stage that is connected in series between the fourth switch terminal and the second switch terminal, wherein:

each of the first, second, third, and fourth field effect transistor stages has a correction capacitance connected between a control electrode and a main electrode, which is connected to one of the first, second, third, and fourth switch terminals, each of said correction capacitances corrects an imbalance of an equivalent capacitance between the respective field effect transistor stage's control and main electrodes during the OFF state of the field effect transistor stage, and the capacitance of each of the correction capacitances is smaller than the depletion layer capacitance, during the ON-state, of the corresponding field effect transistor stage, and larger than the depletion layer capacitance during the OFF-state.

20. A field effect transistor switch circuit comprising:

a first field effect transistor stage that is connected in series between a first switch terminal and a second switch terminal;

a second field effect transistor stage that is connected in series between the first switch terminal and a third switch terminal;

a third field effect transistor stage that is connected in series between the third switch terminal and a fourth switch terminal; and a fourth field effect transistor stage that is connected in series between the fourth switch terminal and the second switch terminal, wherein:

each of said first, second, third, and fourth field effect transistor stages comprises a series circuit having a plurality of field effect transistors, each of the field effect transistors has a correction capacitance connected between the field effect transistor's gate and source/drain electrodes, each of said correction capacitances corrects an imbalance of an equivalent capacitance between the respective field effect transistor's gate and source/drain electrodes during the OFF state of the field effect transistor, and the capacitance of each of the correction capacitances is smaller than the depletion layer capacitance, during the ON-state, of the corresponding field effect transistor, and larger than the depletion layer capacitance during the OFF-state.

\* \* \* \* \*